(12) United States Patent
Maharyta et al.

(10) Patent No.: US 9,209,802 B1
(45) Date of Patent: Dec. 8, 2015

(54) FREQUENCY SELECTION WITH TWO FREQUENCY SETS OF MULTIPLE OPERATING FREQUENCIES IN A MUTUAL CAPACITANCE SENSING DEVICES

(71) Applicant: Parade Technologies, Ltd., Santa Clara, CA (US)

(72) Inventors: Andriy Maharyta, Lviv (UA); Ihor Musijchuk, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 197 days.

(21) Appl. No.: 13/629,281

(22) Filed: Sep. 27, 2012

Related U.S. Application Data

(63) Continuation-in-part of application No. 13/429,869, filed on Mar. 26, 2012.

(60) Provisional application No. 61/602,750, filed on Feb. 24, 2012, provisional application No. 61/677,651, filed on Jul. 31, 2012.

(51) Int. Cl.
*G01R 27/26* (2006.01)
*H03K 17/955* (2006.01)
(Continued)

(52) U.S. Cl.
CPC .............. *H03K 17/955* (2013.01); *G06F 3/044* (2013.01); *G06F 3/0416* (2013.01); *G06F 3/0418* (2013.01); *H03K 2217/960705* (2013.01); *H03K 2217/960775* (2013.01)

(58) Field of Classification Search
CPC ................ H03K 17/955; H03K 2217/960775; H03K 2217/960705; G06F 3/041; G06F 3/0412; G06F 3/0416; G06F 3/0418; G06F 3/044

USPC .......... 324/681, 612, 613, 614; 345/173, 174; 370/254; 702/69

See application file for complete search history.

(56) References Cited

U.S. PATENT DOCUMENTS

| | | |
|---|---|---|
| 7,451,050 B2 | 11/2008 | Hargreaves |
| 7,643,011 B2 | 1/2010 | O'Connor et al. |
| 7,986,193 B2 | 7/2011 | Krah |

(Continued)

FOREIGN PATENT DOCUMENTS

| | | | |
|---|---|---|---|
| EP | 818751 A1 * | 1/1998 | ............. G06K 11/16 |
| WO | 2012108911 A1 | 8/2012 | |

OTHER PUBLICATIONS

Carey, J. (Sep. 2011). "Noise Wars: Projected Capacitance Strikes Back," Cypress Semiconductor Corp White Paper, 8 pages.

(Continued)

*Primary Examiner* — Huy Q Phan
*Assistant Examiner* — David Frederiksen
(74) *Attorney, Agent, or Firm* — Morgan, Lewis & Bockius LLP

(57) ABSTRACT

Apparatuses and methods of frequency selection algorithms and frequency set selection are described. One method monitors a signal on the electrodes of a sense network, determine a first group of noise metrics of noise in the signal, determine a second group of noise metrics. The method switches from a first operating frequency in a first set to a second operating frequency in the first frequency set based on the first group of noise metrics and switches from the first operating frequency in the first set to a third operating frequency in a second frequency set based on the second group of noise metrics.

19 Claims, 27 Drawing Sheets

(51) Int. Cl.
*G06F 3/041* (2006.01)
*G06F 3/044* (2006.01)

(56) References Cited

U.S. PATENT DOCUMENTS

| | | |
|---|---|---|
| 2008/0040079 A1* | 2/2008 | Hargreaves .................... 702/191 |
| 2008/0157893 A1* | 7/2008 | Krah ......................... 331/177 R |
| 2008/0158169 A1* | 7/2008 | O'Connor et al. ............. 345/173 |
| 2008/0309625 A1* | 12/2008 | Krah et al. ..................... 345/173 |
| 2010/0085325 A1* | 4/2010 | King-Smith et al. .......... 345/174 |
| 2010/0290633 A1* | 11/2010 | Chen et al. ....................... 381/57 |
| 2011/0037723 A1 | 2/2011 | Huang et al. |
| 2011/0063993 A1* | 3/2011 | Wilson et al. ................. 370/254 |
| 2011/0119320 A1 | 5/2011 | Wu et al. |
| 2011/0134076 A1* | 6/2011 | Kida et al. ..................... 345/174 |
| 2011/0148810 A1* | 6/2011 | Kitada et al. .................. 345/174 |
| 2011/0157077 A1* | 6/2011 | Martin et al. .................. 345/174 |
| 2011/0175847 A1* | 7/2011 | Wang et al. .................... 345/174 |
| 2011/0241651 A1* | 10/2011 | Oda ............................ 324/76.39 |
| 2011/0242045 A1 | 10/2011 | Park et al. |
| 2011/0310051 A1 | 12/2011 | Souchkov |
| 2012/0001859 A1 | 1/2012 | Kim et al. |
| 2012/0157167 A1 | 6/2012 | Krah et al. |
| 2012/0268415 A1* | 10/2012 | Konovalov et al. ........... 345/174 |

OTHER PUBLICATIONS

Cypress Semiconductor Corporation. (2012). "Cypress TrueTouch Touchscreen Solutions," 7 pages.
Optoelectronics Electronics. (Aug. 24, 2012). "Avoiding EMI in Capacitive Touch Screens," located at www.optoelectronics-electronicspecifier.com/Displays/Avoiding-EMI-in-capacitive-touch-screens.asp, 4 pages,
Rosu-Hamzescu, M. (2010). "mlouch™ Conducted Noise Immunity Techniques for the CTMU," Microchip Technology Inc., 20 pages.
"Using TrueTouch Touch Screen can be Greatly AC Noise in Smooth Work," Shenzhen Easy Touch Technology Co, Ltd. 1 page.
ATMEL "Giving Touchscreen Technology that Personal Feel," 3 pages.
Search Report for "Frequency Selection With Two Frequency Sets of Multiple Operating Frequencies in a Mutual Capacitance Sensing Devices", Sep. 2012, 10 pages.

* cited by examiner

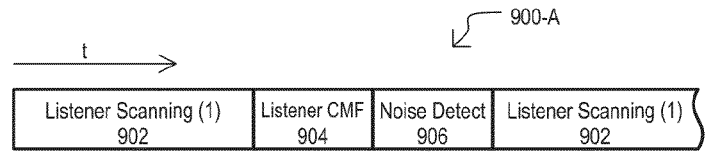
FIG. 9A
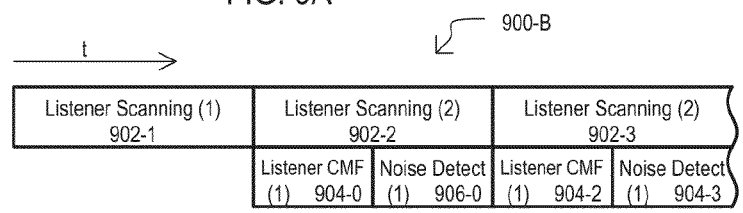
FIG. 9B
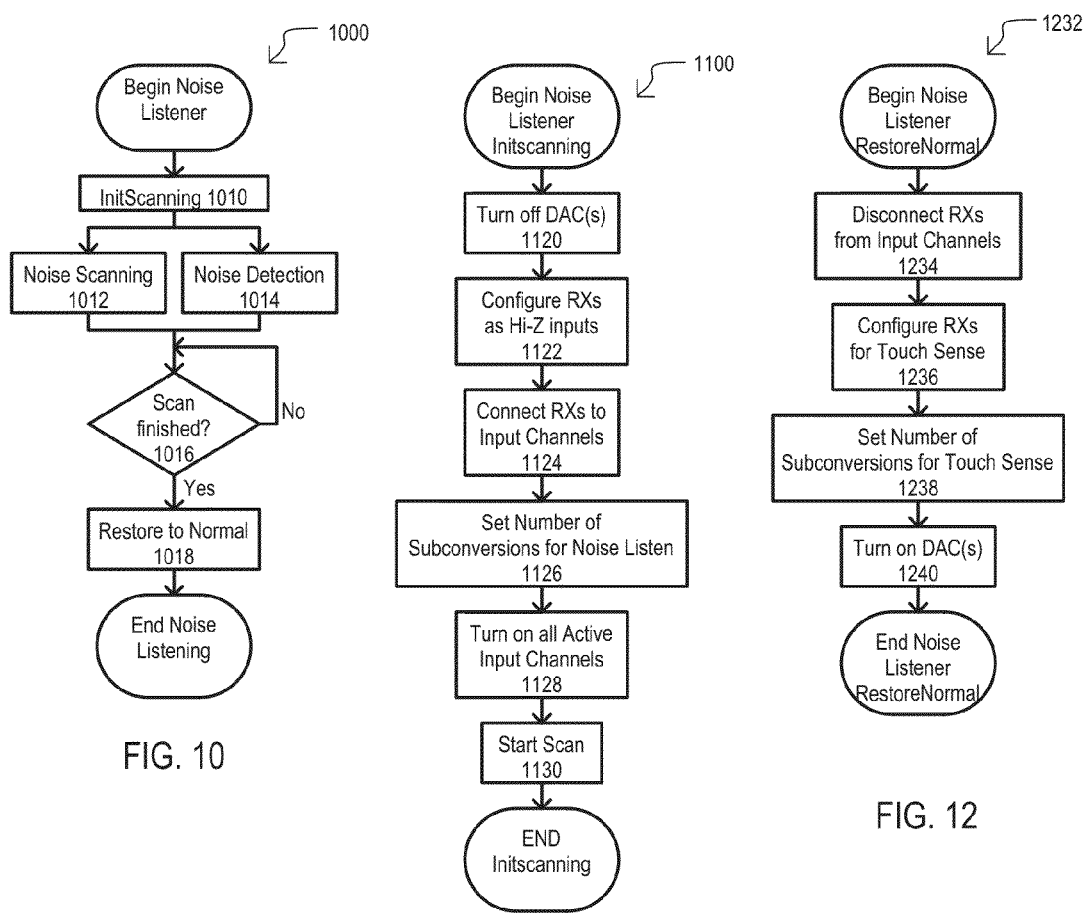
FIG. 10
FIG. 11
FIG. 12

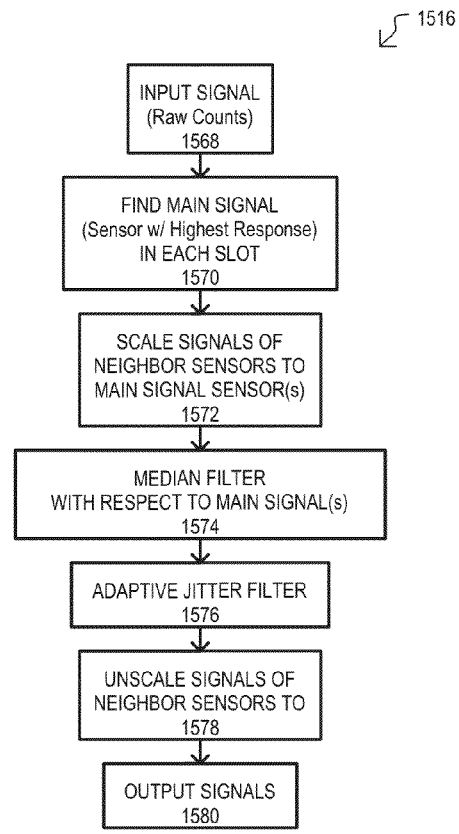
FIG. 15
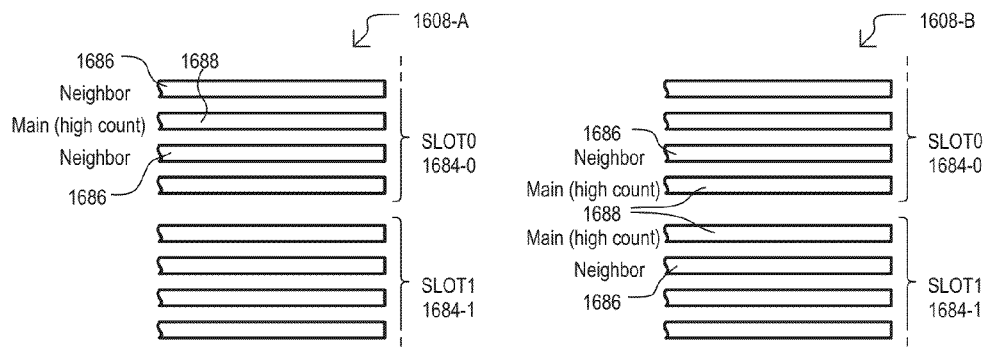
FIG. 16A                    FIG. 16B

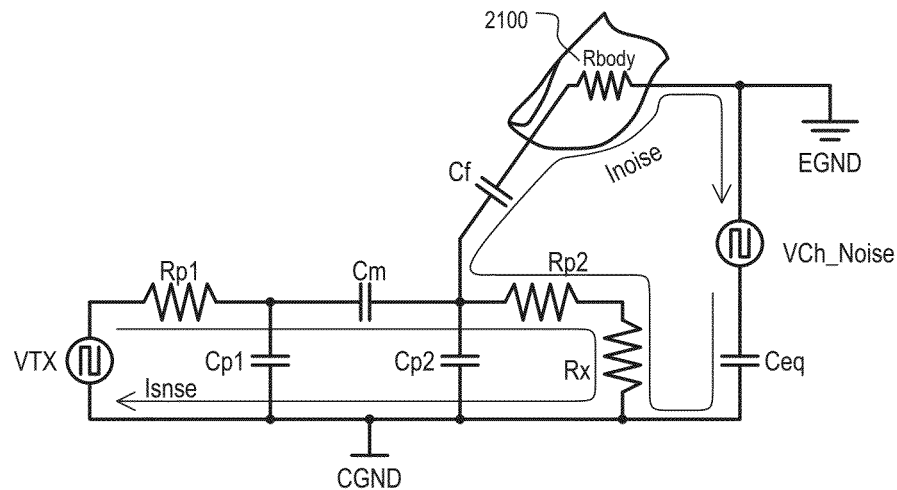
FIG. 21 (BACKGROUND)
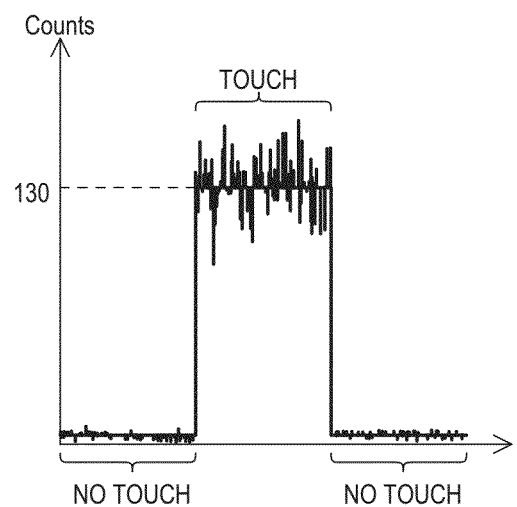
FIG. 22 (BACKGROUND)

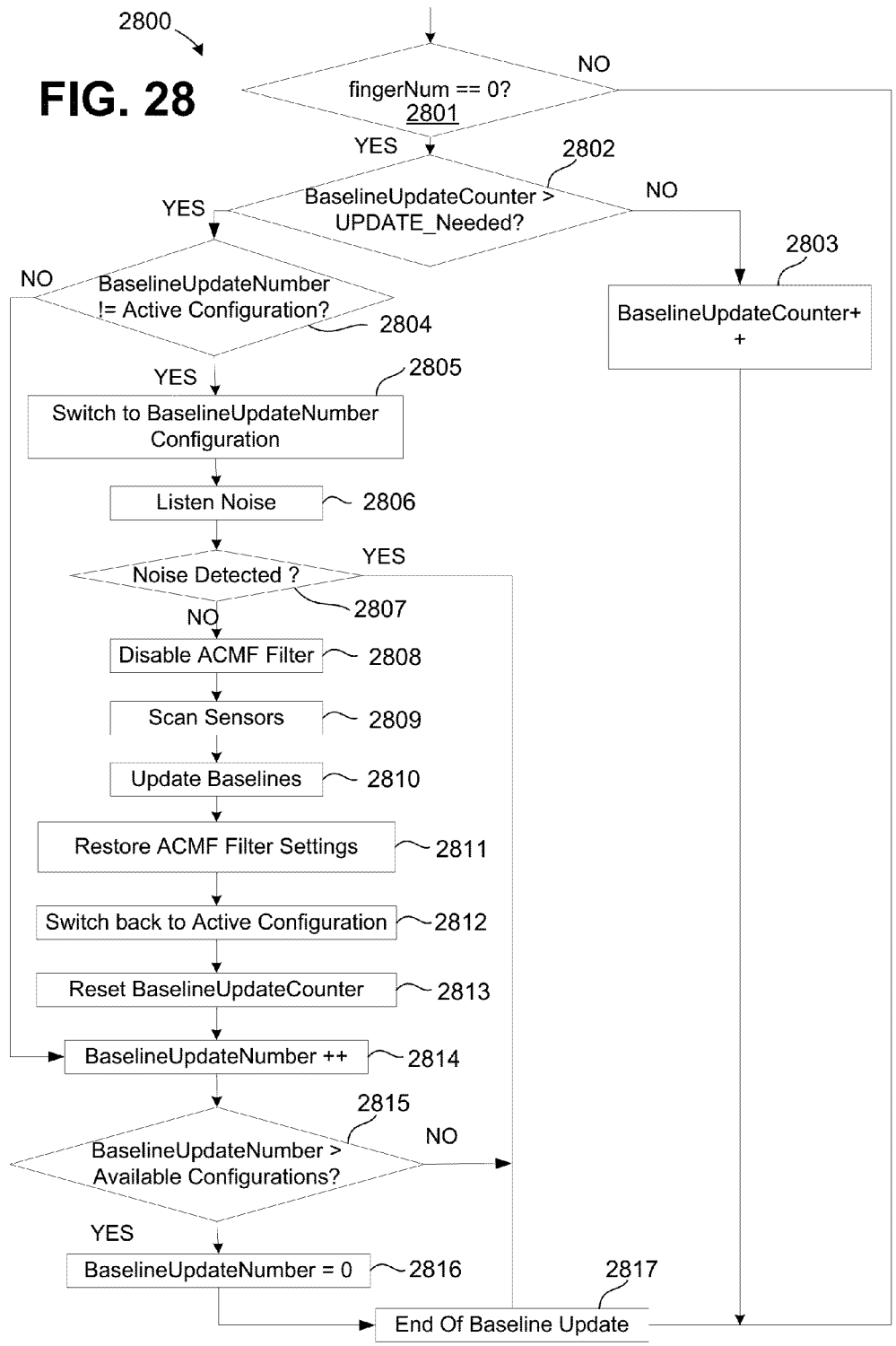

FREQUENCY SELECTION WITH TWO FREQUENCY SETS OF MULTIPLE OPERATING FREQUENCIES IN A MUTUAL CAPACITANCE SENSING DEVICES

RELATED APPLICATIONS

This application is a continuation-in-part application of U.S. patent application Ser. No. 13/429,869, filed Mar. 26, 2012, which claims the benefit of U.S. Provisional Application No. 61/602,750, filed Feb. 24, 2012, the entire contents of both are hereby incorporated by reference. This application also claims the benefit of U.S. Provisional Application No. 61/677,651, filed Jul. 31, 2012, the entire contents of which is hereby incorporated by reference.

TECHNICAL FIELD

The present disclosure relates generally to capacitance sensing systems, and more particularly to noise filtering in such systems.

BACKGROUND

Capacitance sensing systems can sense electrical signals generated on electrodes that reflect changes in capacitance. Such changes in capacitance can indicate a touch event (i.e., the proximity of an object to particular electrodes). Electrical sense signals can be degraded by the presence of noise.

Noise in capacitance sensing systems can be conceptualized as including "internal" noise and "external noise". Internal noise can be noise that can affect an entire system at the same time. Thus, internal noise can appear on all electrodes at the same time. That is, internal noise can be a "common" mode type noise with respect to the sensors (e.g., electrodes) of a system. Sources of internal noise can include, but are not limited to: sensor power supply noise (noise present on a power supply provided to the capacitance sensing circuit) and sensor power generation noise (noise arising from power generating circuits, such as charge pumps, that generate a higher magnitude voltage from a lower magnitude voltage).

In touchscreen devices (i.e., devices having a display overlaid with a capacitance sensing network), a display can give rise to internal noise. As but a few examples, display noise sources can include, but are not limited to: LCD VCOM noise (noise from a liquid crystal display that drives a segment common voltage between different values), LCD VCOM coupled noise (noise from modulating a thin film transistor layer in an LCD device that can be coupled through a VCOM node), and display power supply noise (like sensor power generation noise, but for power supplied of the display).

Common mode type noise can be addressed by a common mode type filter that filters out noise common to all electrodes in a sense phase.

External noise, unlike internal noise, can arise from charge coupled by a sensed object (e.g., finger or stylus), and thus can be local to a touch area. Consequently, external noise is typically not common to all electrodes in a sense phase, but only to a sub-set of the electrodes proximate to a touch event.

Sources of external noise can include charger noise. Charger noise can arise from charger devices (e.g., battery chargers that plug into AC mains, or those that plug into automobile power supplies). Chargers operating from AC mains can often include a "flyback" transform that can create an unstable device ground with respect to "true" ground (earth ground). Consequently, if a user at earth ground touches a capacitance sense surface of a device while the device is connected to a charger, due to the varying device ground, a touch can inject charge at a touch location, creating a localized noise event.

Other sources of external noise can arise from various other electrical fields that can couple to a human body, including but not limited to AC mains (e.g., 50/60 Hz line voltage), fluorescent lighting, brushed motors, arc welding, and cell phones or other radio frequency (RF) noise sources. Fields from these devices can be coupled to a human body, which can then be coupled to a capacitance sensing surface in a touch event.

FIG. 21 is a schematic diagram of model showing charger noise in a conventional mutual capacitance sensing device. A voltage source VTX can be a transmit signal generated on a TX electrode, Rp1 can be a resistance of a TX electrode, Cp1 can be (self) capacitance between a TX electrode and device ground (which can be a charger ground CGND), Cm can be a mutual capacitance between a TX electrode and a receive (RX) electrode, Cp2 can be a self-capacitance of an RX electrode, Rp2 can be a resistance of a RX electrode. Rx can represent an impedance of a capacitance sensing circuit.

Cf can be a capacitance between a sense object 2100 (e.g., finger). A voltage source VCh_Noise can represent noise arising from differences between CGND and earth ground (EGND). Voltage source VCh_Noise can be connected to a device ground by an equivalent capacitance Ceq.

As shown in FIG. 21, a sense current (Isense) can be generated in response to source VTX that can vary in response to changes in Cm. However, at the same time, a noise current (Inoise) can arise a touch event, due to the operation of a charger. A noise current (Inoise) can be additive and subtractive to an Isense signal, and can give rise to erroneous sense events (touch indicated when no touch occurs) and/or erroneous non-sense events (touch not detected).

FIG. 22 shows capacitance sense values (in this case counts) corresponding to non-touch and touch events in a conventional system subject to external noise. As shown, while a device is not touched (NO TOUCH) noise levels are relatively small. However, while a device is touched (TOUCH) noise levels at the touch location are considerably higher.

While capacitance sensing systems can include common mode type filtering, such filtering typically does not address the adverse affects of external noise, as such noise is not present on all electrodes, but rather localized to electrodes proximate a sense event.

BRIEF DESCRIPTION OF THE DRAWINGS

The present invention is illustrated by way of example, and not of limitation, in the figures of the accompanying drawings in which:

FIGS. 9A and 9B are diagrams showing noise listening operations according to an embodiment.

FIG. 10 is a flow diagram of a noise listening operation according to an embodiment.

FIG. 11 is a flow diagram of a noise listening scan initialization operation according to an embodiment.

FIG. 12 is a flow diagram of a noise listening restore-to-normal operation according to an embodiment.

FIG. 15 is a flow diagram of a local noise filtering operation according to an embodiment.

FIGS. 16A and 16B are plan views showing electrode selection for scaling in a filter operation according to an embodiment.

FIG. 21 is a schematic diagram showing charger noise in a conventional mutual capacitance sensing device.

FIG. 22 shows capacitance sense values with external noise corresponding to non-touch and touch events in a conventional system.

FIG. 28 is a flow chart that illustrates a method of an inactive baseline update according to one embodiment.

DETAILED DESCRIPTION

Figure 1:
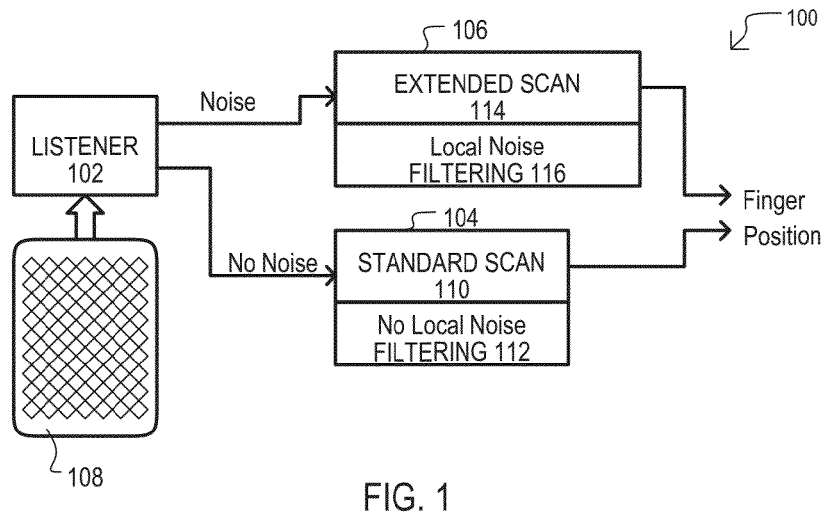
FIG. 1 is a flow diagram of a capacitance sensing operation according to an embodiment.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Various embodiments will now be described that show capacitance sensing systems and methods that listen for noise and alter filtering of sensed values according to a noise level. In particular embodiments, if noise levels are below a certain threshold, indicating the absence of (or low levels of) external noise (i.e., noise localized to a touch area), sensed values can be filtered for common mode type noise. However, if noise levels are above the threshold, sensed valued can be filtered to account for external noise. In particular embodiments, filtering for localized noise can include a median filter.

In the embodiments below, like items are referred to by the same reference character but with the leading digit(s) corresponding to the figure number.

FIG. 1 shows a flow diagram of a capacitance sensing system operation 100 according to one embodiment. A system operation 100 can include a listening operation 102, a no local noise processing path 104, and a local noise processing path 106. A listening operation 102 can monitor a sense network 108 for noise. A sense network 108 can include multiple electrodes for sensing a capacitance in a sensing area. In a particular embodiment, a sense network 108 can be a mutual capacitance sensing network having transmit (TX) electrodes that can be driven with a transmit signal, and receive (RX) electrodes coupled to the TX electrodes by a mutual capacitance.

In some embodiments, a listening operation 102 can use the same electrodes used for capacitance sensing (e.g., touch position detection) for noise detection. In a very particular embodiment, a listening operation 102 can monitor all RX electrodes for noise. In an alternate embodiment, a listening operation 102 can monitor all RX electrodes in a noise listening operation. In yet another embodiment, a listening operation 102 can monitor both TX and RX electrodes in a listening operation.

A listening operation 102 can compare detected noise to one or more threshold values to make a determination on the presence of noise. If noise is determined to be present (Noise), a local noise processing path 106 can be followed. In contrast, if no noise is determined to be present (No Noise), a no local noise processing path 104 can be followed.

Processing paths 104 and 106 show how sense signals derived from sense network 108 can be acquired and filtered. A no local noise processing path 104 can acquire sense values from a sense network 108 with a standard scan 110 and non-local filtering 112. A standard scan 110 can sample electrode values to generate sense values using a set number of sample operations and/or a set duration. Non-local filtering 112 can provide filtering that is not directed at local noise events, such as those arising from external noise. In particular embodiments, non-local filtering 112 can include common mode type filtering that filters for noise common to all sense electrodes.

A local noise processing path 106 can address the adverse affects of local noise, like that arising from external noise. A local noise processing path 106 can acquire sense values from a sense network 108 with an extended scan 114 and local filtering 116. An extended scan 114 can sample electrode values with a larger number of sample operations and/or a longer duration than the standard scan 110. In addition, local filtering 116 can provide filtering to remove local noise events, such as those arising from external noise. In particular embodiments, local filtering 116 can include median filtering.

In this way, in response to the detection of noise, a processing of capacitance sense signals can switch from a standard scan time and non-local filtering to an increased scan time and local filtering.

Figure 2:
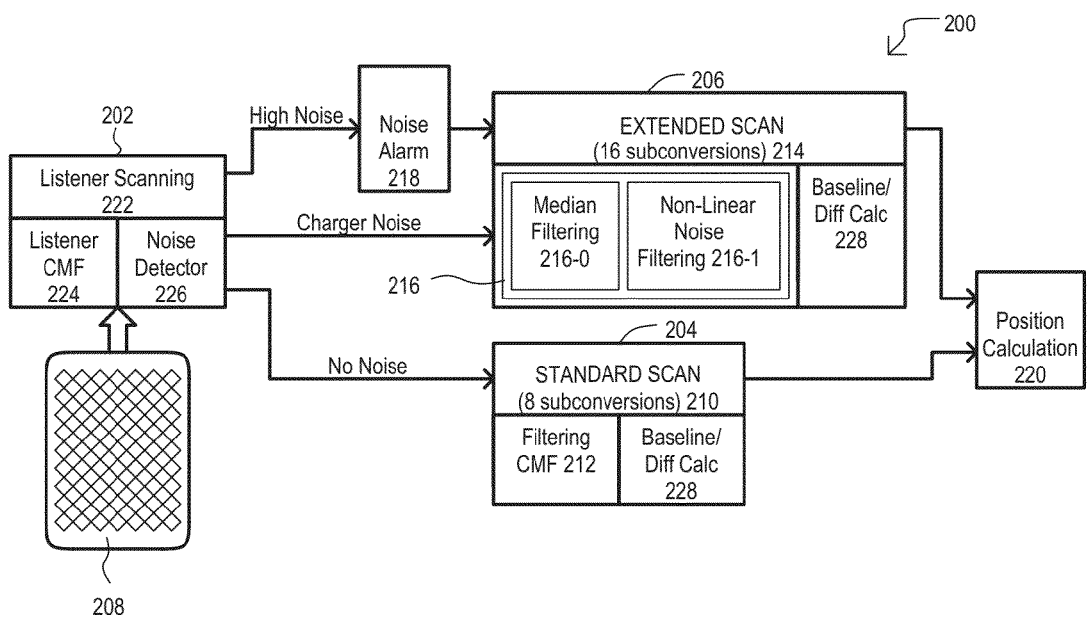
FIG. 2 is a flow diagram of a capacitance sensing operation according to another embodiment.

FIG. 2 shows a flow diagram of a capacitance sensing system operation 200 according to another embodiment. In one particular embodiment, system operation 200 can be one implementation of that shown in FIG. 1. In addition to items like those shown in FIG. 1, FIG. 2 further shows a noise alarm operation 218 and touch position calculation operation 220.

In the embodiment shown, a listening operation 202 can include listener scanning 222, listener common mode filtering (CMF) 224, and noise detection 226. Listener scanning 222 can include measuring signals on multiple electrodes of sense network 208. Scanning (noise signal acquisition) times can be selected based on sense network and expected noise source(s). A listener CMF 224 can filter for noise common to all electrodes being scanned. Such filtering can enable external type noise (noise local to a subset of the scanned electrodes) to pass through for noise detection 226.

Noise detection 226 can establish whether any detected noise exceeds one or more thresholds. In the embodiment shown, if noise is below a first threshold, noise detection 226 can activate a "No Noise" indication. If noise is above a first threshold, noise detection 226 can activate a "Noise" indication. If noise is above a second threshold, greater than the first threshold, noise detection 226 can activate a "High Noise" indication.

In the case of a "No Noise" indication, processing can proceed according to no local noise processing path 204. Such a processing path 204 can utilize a standard scanning 210, which in the particular embodiment shown can include 8 sub-conversions per electrode. A sub-conversion can be an elementary signal conversion event, and can reflect demodulation and/or integration results for one or more full input signal periods. Such processing can further include a CMF filtering 212 of values sensed on multiple electrodes. Such values can then be subject to baseline and difference calculations 228, which can determine and difference between current sense values and baseline values. A sufficiently large difference can indicate a touch event.

In the case of a "Noise" indication, processing can proceed according to local noise processing path 206. Local noise processing 206 can increase signal acquisition time with an extended scanning 214 that utilizes 16 sub-conversion (i.e., doubles a scanning time versus the no noise case). A processing path 206 can further include non-CMF filtering 216 that can filter for external noise events affecting a local set of electrodes. In the particular embodiment shown, non-CMF filtering 216 can include median filtering 216-0 and non-linear filtering 216-1. Resulting filtered sense values can then be subject to baseline and difference calculations 228, like that described for the no local noise processing path 204.

In the case of a "High Noise" indication, processing can include activation of an alarm indication 218. An alarm indication 218 can inform a user and/or a system that noise levels are high enough to result in erroneous capacitance sensing results. In a very particular embodiment, such a warning can be a visual warning on a display associated with the sense network 208 (e.g., a touchscreen display). However, warnings may include various other indication types, including but not limited to: a different type of visual alarm (e.g., LED), an audio alarm, or a processor interrupt, to name just a few. In the embodiment of FIG. 2, in response to a "High Noise" indication, processing may also proceed according to local noise processing path 206. However, in other embodiments, capacitance sense processing could be interrupted, or additional filtering or signal boosting could occur.

Operation 200 can also include touch position calculations 220. Such actions can derive positions of touch events from sense values generated by processing paths 204 and 206. Touch position values generated by calculations 220 can be provided to a device application, or the like.

In this way, a listening circuit can include common mode filtering of sense electrodes to listen for localized noise events, such as external noise from a device charger or the like. Sense signals can be filtered based on sensed noise values and/or an alarm can be triggered if noise levels exceed a high threshold value.

Figure 3:
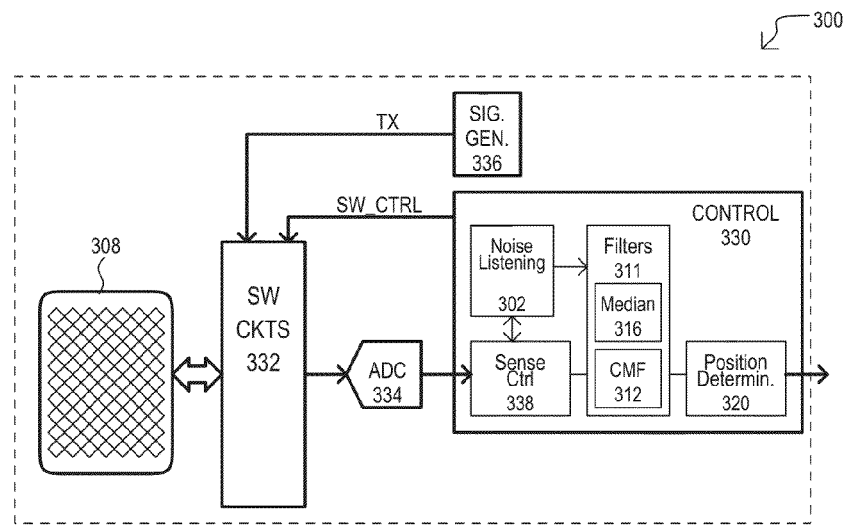
FIG. 3 is a block schematic diagram of a capacitance sensing system according to an embodiment.

Referring now to FIG. 3, a capacitance sensing system according to an embodiment is shown in a block schematic diagram and designated by the general reference character 300. A system 300 can include a sense network 308, switch circuits 332, an analog-to-digital converter (ADC) 334, a signal generator 336, and a controller 330. A sense network 308 can be any suitable capacitance sense network, including a mutual capacitance sensing network, as disclosed herein. A sense network 308 can include multiple sensors (e.g., electrodes) for sensing changes in capacitance.

Switch circuits 332 can selectively enable signal paths, both input and output signal paths, between a sense network 308 and a controller 330. In the embodiment shown, switch circuits 332 can also enable a signal path between a signal generator 336 and sense network 308.

An ADC 334 can convert analog signals received from sense network 308 via switching circuits 308 into digital values. An ADC 334 can be any suitable ADC, including but not limited to a successive approximation (SAR) ADC, integrating ADC, sigma-delta modulating ADC, and a "flash" (voltage ladder type) ADC, as but a few examples.

A signal generator 336 can generate a signal for inducing sense signals from sense network 308. As but one example, a signal generator 336 can be a periodic transmit (TX) signal applied to one or more transmit electrodes in a mutual capacitance type sense network. A TX signal can induce a response on corresponding RX signals, which can be sensed to determine whether a touch event has occurred.

A controller 330 can control capacitance sensing operations in a system 300. In the embodiment shown, a controller can include sense control circuits 338, filter circuits 311, position determination circuits 320, and noise listening circuits 302. In some embodiments, controller 330 circuits (e.g., 338, 311, 320 and 302) can be implemented by a processor executing instructions. However, in other embodiments, all or a portion of such circuits can be implemented by custom logic and/or programmable logic.

Sense control circuits 338 can generate signals for controlling acquisition of signals from sense network 308. In the embodiment shown, sense control circuits 338 can activate switch control signals SW_CTRL applied to switching circuits 332. In a particular embodiment, mutual capacitance sensing can be employed, and sense control circuits 338 can sequentially connect a TX signal from signal generator 336 to TX electrodes within sense network 308. As each TX electrode is driven with the TX signal, sense control circuits 338 can sequentially connect RX electrodes to ADC 334 to generate digital sense values for each RX electrode. It is understood that other embodiments can use different sensing operations.

Noise listening circuits 302 can also control acquisition of signals from sense network 308 by activating switch control signals SW_CTRL. However, noise listening circuit 302 can configure paths to sense network 308 to enable the detection of local noise, as opposed to touch events. In a particular embodiment, noise listening circuit 302 can isolate signal generator 336 from sense network 308. In addition, multiple groups of electrodes (e.g., RX, TX or both) can be simultaneously connected to ADC 334. Noise listener 302 can filter such digital values and then compare them to noise thresholds to determine a noise level. Such actions can include arriving at "No Noise", "Noise" and optionally "High Noise" determinations as described for FIG. 2.

In response to a noise determination from noise listening circuit 302, a controller 330 can alter capacitance sensing operations. In one embodiment, if noise is detected, signal acquisition times can be increased (e.g., sub-conversions increased) and filtering can be changed (e.g., median filtering instead of common mode filtering).

Filter circuits 311 can filter sense values generated during sense operations and noise detection operations. In the embodiment shown, filter circuits 311 can enable one or more types of median filtering 316 and one or more types of CMF 312. It is understood that filter circuits can be digital circuits operating on digital values representing sensed capacitance. In a particular embodiment, filter circuits 311 can include a processor creating sense value data arrays from values output from ADC 334. These arrays of sense values can be manipulated according to one or more selected filtering algorithm to create an output array of filtered sense values. A type of filtering employed by filter circuits 311 can be selected based on detected noise levels.

Position determination circuits 320 can take filtered sense values to generate touch position values (or no detected touches) for use by other processes, such as applications run by a device.

In this way, a capacitance sensing system can include listening circuits for detecting noise values and digital filters, selectable based on a detected noise level.

Figure 4:
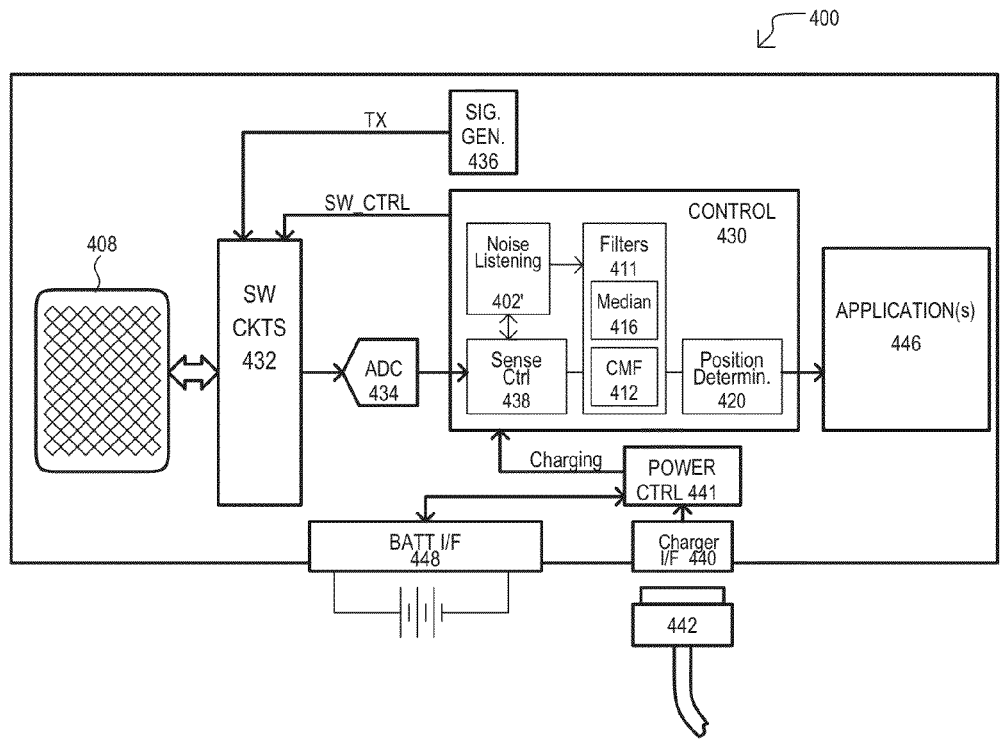
FIG. 4 is a block schematic diagram of a capacitance sensing system having charger detection according to an embodiment.

Referring now to FIG. 4, a capacitance sensing system according to another embodiment is shown in a block schematic diagram and designated by the general reference character 400. In the embodiment of FIG. 4, a noise listening operation can vary based on a system condition. In the particular embodiment shown, noise listening can be enabled or disabled based on the presence of a charger.

A system 400 can include sections like those of FIG. 3, and such sections can have the same or equivalent structures as FIG. 3. FIG. 4 differs from FIG. 3 in that it also shows a charger interface 440, battery interface 448, power control circuits 441, and application(s) 446.

A charger interface 440 can enable power to be provided to system 400 that charges a battery via a battery interface 448. In some embodiments, a charger interface 440 can be a physical interface that creates a mechanical connection between a charger 442 and the system 400. In a particular embodiment, such a physical connection can include a ground connection that can give rise to injected current as represented in FIG. 22. However, alternate embodiments can include wireless charging interfaces.

Power control circuits 441 can activate a charging indication (Charging) when a charger 442 is coupled to a system 400, and thus can present an external noise source. In addition, power control circuits 441 can control charging operations of a battery via batter interface 448.

Referring still to FIG. 4, listening circuits 402' can vary listening operations in response to a charger indication (Charging). In one embodiment, if the Charging indication is inactive, indicating that a charger 442 is not present, listening circuits 402' can be disabled. If the Charging indication is active, listening circuits 402' can be enabled. However in other embodiments, listening circuits 402' can switch between different types of listening operations based on a charger indication (Charging).

It is understood that while a charger can be one source of noise, other types of power supplies for a device can be a source of noise (e.g., AC/DC converters within such devices). For example, some devices can be connected to a computer with its own external power supply, or even a charger within an automobile.

Application(s) 446 can be programs executable by a system 400 utilizing position values from position determination circuits 420.

In this way, a capacitance sensing system can vary listening circuit operations that detect noise values based on a physical condition of the system.

Figure 5:
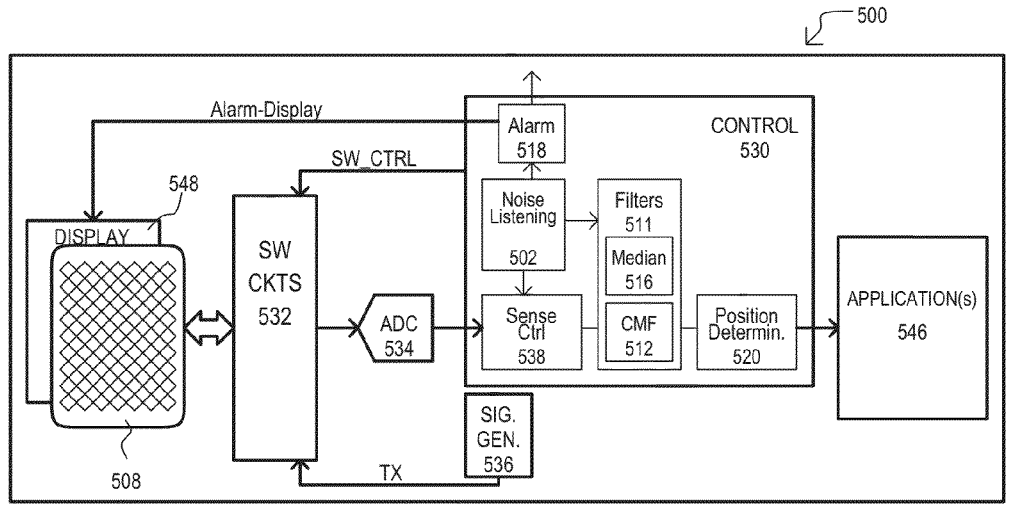
FIG. 5 is a block schematic diagram of a capacitance sensing system having a display alarm according to an embodiment.

Referring now to FIG. 5, a capacitance sensing system according to a further embodiment is shown in a block schematic diagram and designated by the general reference character 500. In the embodiment of FIG. 5, an alarm can be generated when noise exceeds a threshold value.

A system 500 can include sections like those of FIG. 3, and such sections can have the same or equivalent structures as FIG. 3. FIG. 5 differs from FIG. 3 in that is also shows an alarm circuit 518, a display 548 and application(s) 546.

A listening circuit 502 can provide a noise level indication to alarm circuit 518 when detected noise is determined to exceed a high threshold. An alarm circuit 518 can activate one or more alarms, when the noise threshold is exceeded. In the very particular embodiment shown, alarm circuit 518 can provide an alarm (Alarm-Display) to display 548. In response to such an alarm, a display 548 can show a visual alarm indicating that touch inputs are affected by noise (e.g., touch inputs will not be accepted, etc.). In one particular embodiment, display 548 and sense network 508 can be a touchscreen assembly (i.e., sense network 508 is physically overlaid on display 548).

In some embodiments, an alarm circuit 518 can provide an alarm to application(s) 546. Such applications can then alter execution and/or generate their own alarm. Further, as noted in conjunction with FIG. 2, an alarm can take various other forms (e.g., an interrupt, or the like).

In this way, a capacitance sensing system can generate an alarm for a user in the event noise levels exceed a predetermined threshold.

Figure 6:
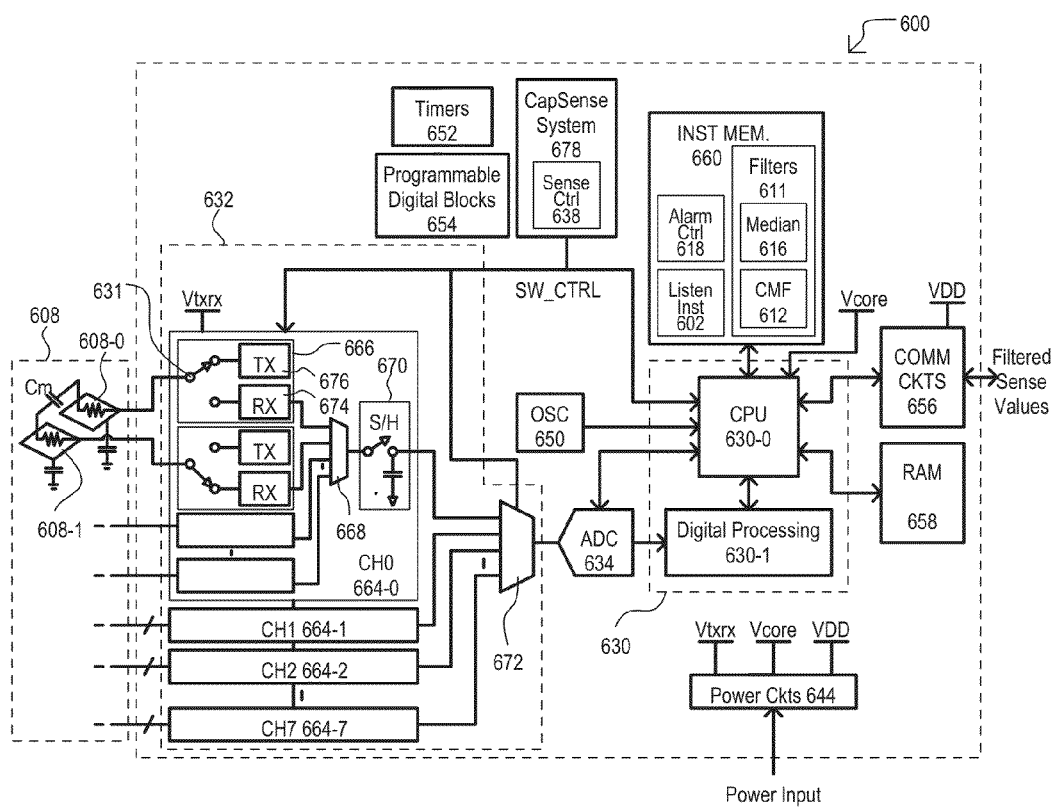
FIG. 6 is a block schematic diagram of a capacitance sensing system according to another embodiment.

Referring now to FIG. 6, a capacitance sensing system according to another embodiment is shown in a block schematic diagram and designated by the general reference character 600. The embodiment of FIG. 6 shows an implementation utilizing a processor and instructions to provide listening, selectable filtering, and alarm functions.

A system 600 can include switching circuits 632, controller 630, a capacitance sense system 678, oscillator circuits 650, an ADC 634, instruction memory 660, communication circuits 656, random access memory (RAM) 658, and a power control circuits 644.

Switching circuits 632 can provide analog signal paths between a sense network 608 and circuits within a system 600. In the embodiment shown, switching circuits 632 can include a number of channels 664-0 to -7 and a channel multiplexer (MUX) 672. Switching and MUXing operations within switching circuits 632 can be controlled by switch control signals (SW_CTRL) provided by controller 630. Each channel (664-0 to -7) can include a number of input/output (I/O) switches (one shown 666) connected to an I/O connection 631, an I/O MUX 668, and a sample and hold (S/H) circuit 670. Each I/O switch (666) can connect a corresponding I/O 631 to a RX path (one shown as 674) or a TX path (one shown as 676). I/O MUX 668 can connect one of RX paths 674 within a channel to the corresponding S/H circuit 670. TX paths 676 can receive a TX signal. A channel MUX 672 can selectively connect a S/H circuit 670 within each channel (664-0 to -7) to ADC 634.

An ADC 634 can include any suitable ADC as described herein, or an equivalent.

FIG. 6 shows a system 600 connected to mutual capacitance sense network 608. Sense network 608 can include TX electrodes formed by TX plates (one shown as 608-0) and RX plates (one shown as 608-1). By operation of switching circuits 632, TX electrodes can be connected to a TX path 676, while multiple RX electrodes are connected to corresponding RX paths 674.

In the embodiment of FIG. 6, a controller 630 can include a processor 630-0 and digital processing circuits 630-1. A processor 630-0 can control operations of digital processing circuits 630-1 in response to instructions stored in instruction memory 660. Instruction memory 660 can include noise listening instructions 602, alarm control instructions 618, and filter instructions 611. Filter instructions 611 can include multiple filtering operations, and in the embodiment shown, can include median filter instructions 616 and CMF instructions 612.

In response to noise listening instructions 602, a controller 630 can generate signals that connect multiple I/Os 631 to ADC 634. In one embodiment, values can be subject to an initial listening CMF operation. Such an operation can be called from filter instructions 611 or be built into noise listening instructions 602. Resulting values can then be compared to one or more thresholds to determine a noise level. If a noise level exceeds a certain level, a listening circuit 602 can establish capacitance sensing parameters directed to filtering local noise (e.g., an external noise source). In some embodiments, such parameters can include those described for other embodiments, including an increased scan time and/or non-common mode (e.g., median) filtering. In addition, if a noise threshold level is above another certain level, alarm instructions 618 can be called to generate an appropriate alarm.

Processor 630-0 alone, or in combination with digital processing circuits 630-1, can perform arithmetic and logic operations for detecting noise and/or filtering sense values.

Capacitance sensing system 678 can include circuits for performing capacitance sensing operations. In some embodiments, capacitance sensing system 678 can include sense control circuits 638 that generate switch control signals for controlling switching circuits 632. In one embodiment, capacitance sensing system 678 can perform sensing operation based on criteria established by controller 630. In a particular embodiment, a controller 630 can vary a sensing time (e.g., number of sub-conversions) based on a noise level.

Referring still to FIG. 6, oscillator circuits 650 can generate signals for controlling timing of operations within system 600. In one embodiment a TX signal presented at TX paths 676 can be provided by, or derived from signals generated by oscillator circuits 650.

Communication circuits 656 can provide capacitance sensing results to other systems or circuits of a device containing the capacitance sensing system 600. RAM 658 can be provided to enable processor 630-0 to execute arithmetic operations and/or temporarily store instruction data. In particular embodiments, a RAM 658 can store sense value matrices that are manipulated by processor 630-0 to detect noise and/or filter capacitance sense values.

Power control circuits 644 can generate power supply voltages for various portions within a system 600. In some embodiments, power control circuits 644 provide a charging indication, like that described for FIG. 4, which can indicate when a charger is coupled to the system 600. A processor 630-0 can then bypass noise listening instructions 602 in the absence of a charger, or may select between multiple listening algorithms based on the presence or absence of a charger.

FIG. 6 also shows timer circuits 652 and programmable circuits 654. Timer circuits 652 can provide timing functions for use by various sections of system 600. Programmable circuits 654 can be programmed with configuration data to perform custom function. In the embodiment shown, programmable circuits 654 can include programmable digital blocks.

In a very particular embodiment, a system 600 can be implemented with the PSoC® 3 type programmable system-on-chip developed by Cypress Semiconductor Corporation of San Jose, Calif. U.S.A.

In this way, a capacitance sensing system can include a processor that can execute any of: noise listening instructions, noise alarm instructions, median filtering, and CMF.

Figure 7:
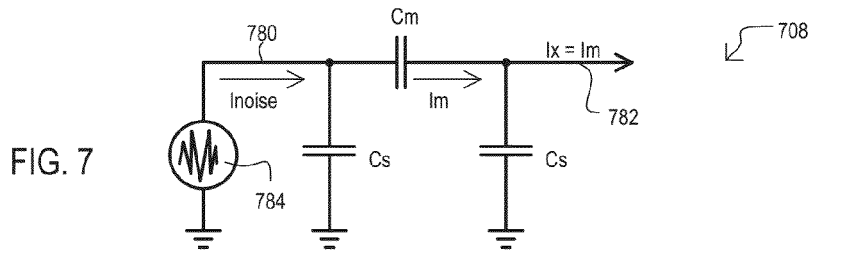
FIG. 7 is a schematic diagram of a noise listening circuit according to an embodiment.

FIG. 7 is a schematic diagram showing a noise listening configuration for a mutual capacitance sense network 708 according to an embodiment. A sense network 708 can include first electrodes (one shown as 780) and second electrodes (one shown as 782) coupled to one another by a mutual capacitance Cm. Noise, represented by noise voltage source 784, on one or more first electrodes 780 can induce a noise signal (Ix) by mutual capacitance coupling. In a very particular embodiment, first electrodes 780 can be TX electrodes and second electrodes 782 can be RX electrodes. However, the TX electrodes are not driven by any system generated TX signal, but rather are used to detect noise.

Figure 8A:
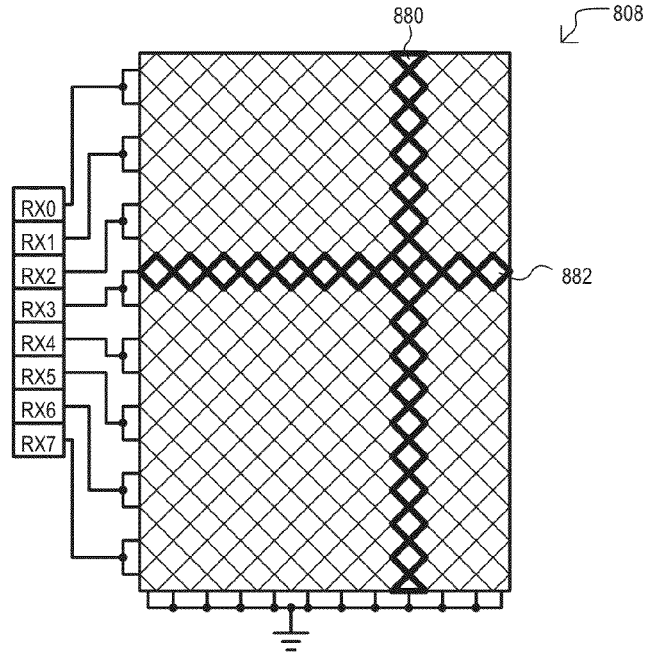
FIGS. 8A and 8B are plan views of a noise listening configurations for a mutual capacitance sense network according to embodiments.
Figure 8B:
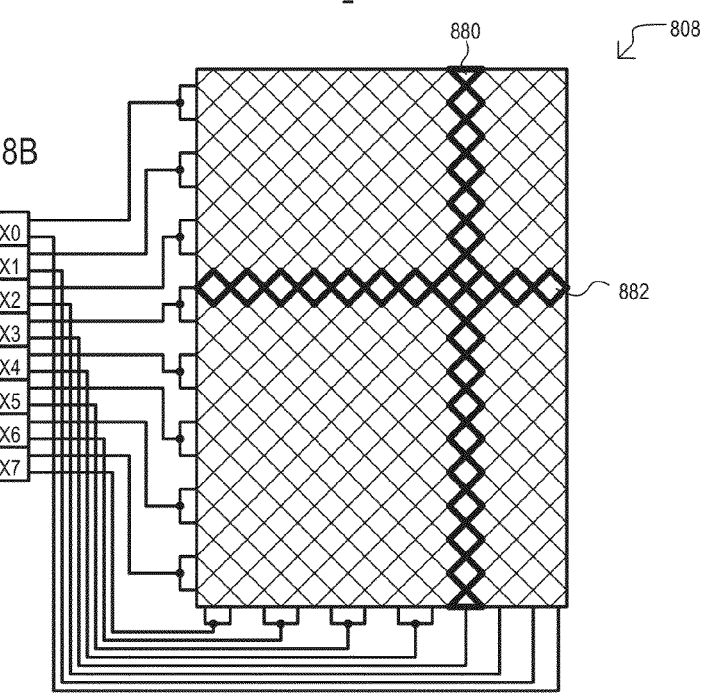

FIGS. 8A and 8B show different noise listening configurations according to embodiments.

FIG. 8A shows a noise listening configuration for a mutual capacitance sense network 808 according to one embodiment. Sense network 808 can include TX electrodes (one highlighted as 880) arranged in one direction and RX electrodes (one highlighted as 882) arranged in another direction. In the embodiment shown, sets of RX electrodes 882 (in this embodiment, sets of two) can be connected to RX paths (RX0 to RX7) for noise listening operations. TX electrodes 880 can be connected to ground.

FIG. 8B shows a noise listening configuration for a mutual capacitance sense network 808 according to another embodiment. Sense network 808 can have the structure shown in FIG. 8A. However, RX electrodes 882 and TX electrodes 880 can be commonly connected to a same RX path. In the particular embodiment shown, RX paths RX0 to RX3 can be connected to two RX electrodes 882 and one TX electrode 880, while RX paths RX4 to RX7 can be connected to two RX electrodes 882 and two TX electrodes 880.

In this way, RX and/or TX electrodes of a mutual capacitance sense network can be connected to capacitance sensing inputs to listen for noise while a TX signal is prevented from being applied to the network.

FIGS. 9A and 9B show listening operations according to embodiments.

FIG. 9A shows a listening operation 900-A having serial noise listening operations. Progression of time is shown by arrow "t". A listening operation 900-A can begin with a listening scanning action 902. Such an action can include acquiring capacitance values across multiple sensors (e.g., electrodes). In particular embodiments, such a step can include establishing connections to a mutual capacitance sense array like that shown in FIG. 8A or 8B. Following a listening scanning 902, acquired values can be subject to listening CMF 904. A listening CMF 904 can include common mode filtering that can filter out noise common to all electrodes and thus help isolate local noise (e.g., external type noise). Filtered sense values can then be subject to a noise detection action 906. Such an action can compare sensed capacitance levels to one or more limits to determine a noise level. Following a noise detection action 906, a listening operation 900-A can repeat, performing another listening scanning action 902.

FIG. 9B shows a listening operation 900-B having pipelined noise listening operations. Progression of time is shown by arrow "t". A listening operation 900-B can begin with a listening scanning action 902-1, which can acquire a first set of raw capacitance values. Following listening scanning operation 902-1, a next listening scanning operation 902-2 can begin. However, while such second scanning action (902-2) is undertaken, the first set of raw data acquired with the first scanning action 902-1 can be common mode filtered 904-0 and subject to noise detection 906-0.

In this way, while raw data is gathered for noise listening on electrodes, previously gathered raw data can be common mode filtered and checked for noise events.

In some mutual capacitance embodiments, that drive TX electrodes with a transmit (i.e., excitation) signal while RX electrodes provide sense signals via a mutual capacitance, in a listening scanning action (e.g., 902 and/or 902-1), capacitance can be sensed on RX electrodes, but without the TX electrodes being driven with a transmit signal.

FIG. 10 shows a noise listening operation 1000 according to one embodiment in a flow diagram. An operation 1000 can include a scanning initialization 1010. A scanning initialization can configure connections to a sense network to enable the sensing of noise across multiple channels. Such an initialization can include changing sense network configurations from a standard touch sensing configuration to a noise listening configuration.

Once scanning initialization 1010 is complete, an operation 1000 can, in parallel, perform noise scanning 1012 and noise detection 1014. Noise scanning 1012 can include acquiring sense values from electrodes. Noise detection 1014 can include detecting noise from previously acquired sense values. Once noise scanning is complete (Yes from 1016), a noise listening operation 1000 can restore a sense network to a normal state 1018. A normal state can be that utilized for standard sensing operations (e.g., touch sensing).

FIG. 11 shows a scanning initialization operation 1100 according to an embodiment. A scanning initialization operation 1100 can be one particular implementation of that shown as 1010 in FIG. 10. Scanning initialization operation 1100 can be a scanning initialization operation for a mutual capacitance sense network. An operation 1100 can include disabling any circuits utilized in standard scanning operations that could interfere with noise detection (1120). In the embodiment shown, an action 1120 can include turning off current digital-to-analog converters (iDACs) connected to a sense network. RX paths can be configured as high impedance inputs (1122). RX paths can then be connected to input channels (1124). A signal acquisition time (e.g., scan time) can then be set that is suitable for the noise to be detected. In the embodiment of FIG. 11, such an action can include setting a number of sub-conversions (1126) to a predetermined value. All active channels can then be turned on (1128). Such an action can enable electrodes to be connected to capacitance sensing circuits. A scan can then start (1130). Such an action can acquire raw sense values to enable noise to be detected. A scanning initialization operation 1100 can then end.

FIG. 12 shows a restore-to-normal operation 1232 according to an embodiment. A restore-to-normal operation 1232 can be one particular implementation of that shown as 1018 in FIG. 10. Restore-to-normal operation 1232 can include disconnecting all RX paths from input channels (1234). Such RX channels can then be configured for standard sensing operations (1236). A signal acquisition time (e.g., scan time) can then be returned to that utilized for standard sensing operations (1238). In the embodiment of FIG. 12, such an action can include setting a number of sub-conversions. An operation 1232 can include enabling previously disabled circuits utilized in standard scanning operations (1240). In the embodiment shown, an action 1240 can include turning on iDACs. A restore to normal operation 1232 can then end.

Figure 13:
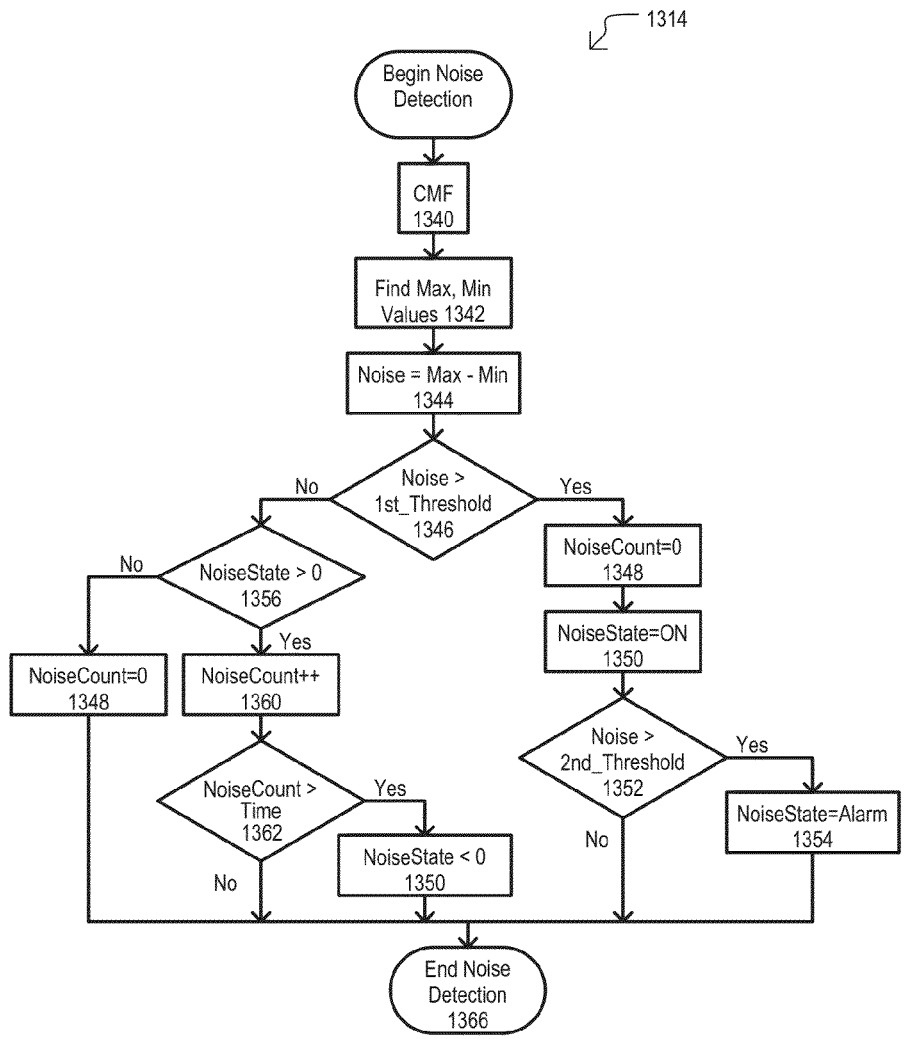
FIG. 13 is a flow diagram of a noise detection operation according to an embodiment.

FIG. 13 shows a noise detection operation 1314 according to an embodiment. A noise detection operation 1314 can be one particular implementation of that shown as 1014 in FIG. 10. A noise detection operation 1314 can include a CMF operation 1340. Such filtering can remove noise common to electrodes and thus can improve a signal from any local noise (i.e., external noise). Operation 1314 can then determine a noise value. In the particular embodiment shown determining a noise value can include finding maximum and minimum values from the CMF filtered values (1342), and then determining the difference between such values (1344).

A noise value can then be compared to a first threshold (1346). If a noise value is above a first threshold (Yes from 1346), a listening timeout value can be reset (1348) and a noise level can be set to a first value (ON) (1350). If noise has been determined to above a first threshold, the noise can also be compared to a second threshold (1352). If a noise value is above a second threshold (Yes from 1352), a noise level can be set to a second value (Alarm) (1354). An operation can then end 1366. If a noise value is below a second threshold (No from 1352), an operation can also end 1366.

If a noise value is not above a first threshold (No from 1346), a noise detection operation 1314 can determine if a noise level should be returned to a zero value (i.e., no noise). In the embodiment shown, if a noise level can be checked to see if it still indicates a high noise state (i.e., ON or Alarm) (1356). If no elevated noise is indicated (No from 1356) a timeout value can be reset (1348). If elevated noise is indicated (Yes from 1356) a timeout value can be incremented (1360). The timeout value can then be compared to a limit (1362). If a timeout value exceeds a limit (Yes from 1362), the noise level can be returned to the no noise state (1350). If a timeout value does not exceed a limit (No from 1362), an operation can end 1366.

Figure 14:
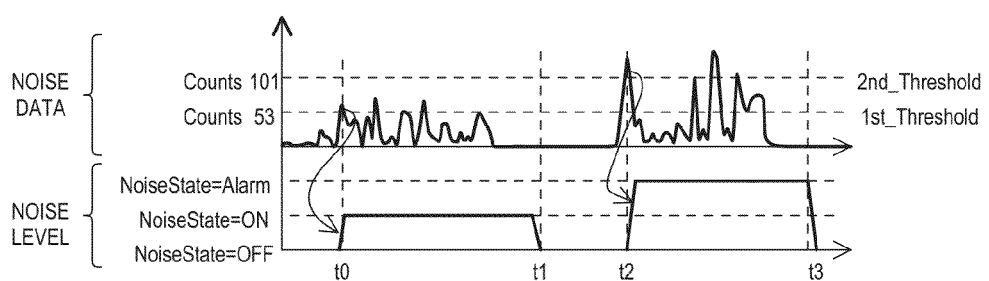
FIG. 14 is a timing diagram showing a noise detection operation that can provide an alarm condition according to an embodiment.

FIG. 14 is a timing diagram showing a noise detection operation according to one embodiment. FIG. 14 includes a waveform NOISE DATA, showing noise sense values acquired by a noise listening operation. Projected onto the NOISE DATA waveform are two noise threshold levels ($1^{st}$_Threshold and $2^{nd}$_Threshold).

FIG. 14 also includes a waveform NOISE LEVEL that shows noise levels determined by a noise detection operation. NOISE LEVEL can indicate three different noise levels. NoiseState=OFF can show noise values below a first threshold ($1^{st}$_Threshold). NoiseState=ON can show noise values above the first threshold ($1^{st}$_Threshold). NoiseState=Alarm can show noise values above a second threshold (2nd_Threshold).

Referring still to FIG. 14, at about time t0, noise values can exceed a first threshold. As a result, a noise detection operation can set a noise level to ON. Eventually, noise levels time out, and at time t1, noise levels can return to an OFF state.

At about time t2, noise values can exceed a second threshold. As a result, a noise detection operation can set a noise level to Alarm. Eventually, noise levels time out, and at time t3, noise levels can return to an OFF state.

Referring now to FIG. 15, a local noise filtering operation 1516 according to an embodiment is shown in a flow diagram. A local noise filtering operation 1516 can be performed on sense data in the event local (i.e., not common mode) noise levels are determined to exceed a certain level. An operation 1516 can include inputting sense signals (1568). Such an action can include inputting raw count values generated from an ADC connected to sense electrodes.

An operation 1516 can find a main signal (1570). Such an action can locate a potential touch location. As will be recalled, local noise can present around touch locations. In one embodiment, a main signal can correspond to a sensor having a highest response (which would, in the absence of noise, indicate a touch). An operation 1516 can then scale signals from neighboring sensors to the corresponding main sensor signal (1572). Neighbor sensors can be sensors physically proximate to the main sensor. In one embodiment, neighbor sensors can be sensor on opposing sides of a main sensor. A scaling operation can alter a sense value of a neighbor electrode based on how such an electrode varies from the main when a valid touch event occurs.

In one very particular embodiment, scaling can be based on a mean value when a touch is present for an electrode. Sense values for neighboring electrodes can be scaled according to scaling factors as follows:

$$k_A = (B_{Tmean}/A_{Tmean}), k_C = (B_{Tmean}/C_{Tmean})$$

where $k_A$ is a scaling factor for a count value from an electrode A which is a neighbor of an electrode B, $k_C$ is a scaling factor for a count value from an electrode C which is a neighbor of an electrode B opposite electrode A, and $A_{Tmean}$, $B_{Tmean}$, and $C_{Tmean}$ are mean sense values derived from touches to such electrodes.

Following a scaling of neighbor sensors, a median filter can be applied with respect to the main signal (1574). Such an action can include applying a median filter to sense values for electrodes. In one embodiment, a median filter can be applied to sensor signals from three consecutive time periods. A true touch event can provide an increase count value that may be sustained over multiple time periods. In contrast, local noise levels may vary in polarity over time. A median filter operation (e.g., 1574) can be a first type of non-linear filtering that is performed.

An operation 1516 can also include an adaptive jitter filter (AJF) operation (1576). An AJF operation (e.g., 1576) can be another non-linear filter operation. One particular example of an AJF operation is described below in more detail.

Following an AJF operation (1576), a previous scaling operation (e.g., 1572) can be reversed. That is filtered sense values corresponding to neighbor sensors proximate a main sensor can be "unscaled" (1578). A resulting set of sense values can then be output 1580.

FIGS. 16A and 16B show a determination of a main signal from electrodes according to an embodiment. FIGS. 16A and 16B show electrodes physically arranged into two groups, shown as slots 1684-0/1. A sense operation can sense capacitance values for different slots with different sense operations. In one very particular embodiment, slots 1684-0/1 can be RX electrodes coupled to a same TX electrode(s) by a mutual capacitance.

FIG. 16A shows a sense operation that determines electrode 1688 has a highest response (count in this embodiment). Consequently, such an electrode can be considered a "main" electrode. Electrodes 1686 adjacent to main electrode 1688 can be considered neighbor electrodes. Sense values corresponding to neighbor electrodes 1686 can be scaled with respect to a sense value for main electrode.

FIG. 16B shows a sense operation in which main electrodes 1688 occur on ends of adjacent slots 1684-0/1. In such an arrangement, a neighbor electrode 1686 for each main electrode can be an electrode in a different slot.

Figure 17A:
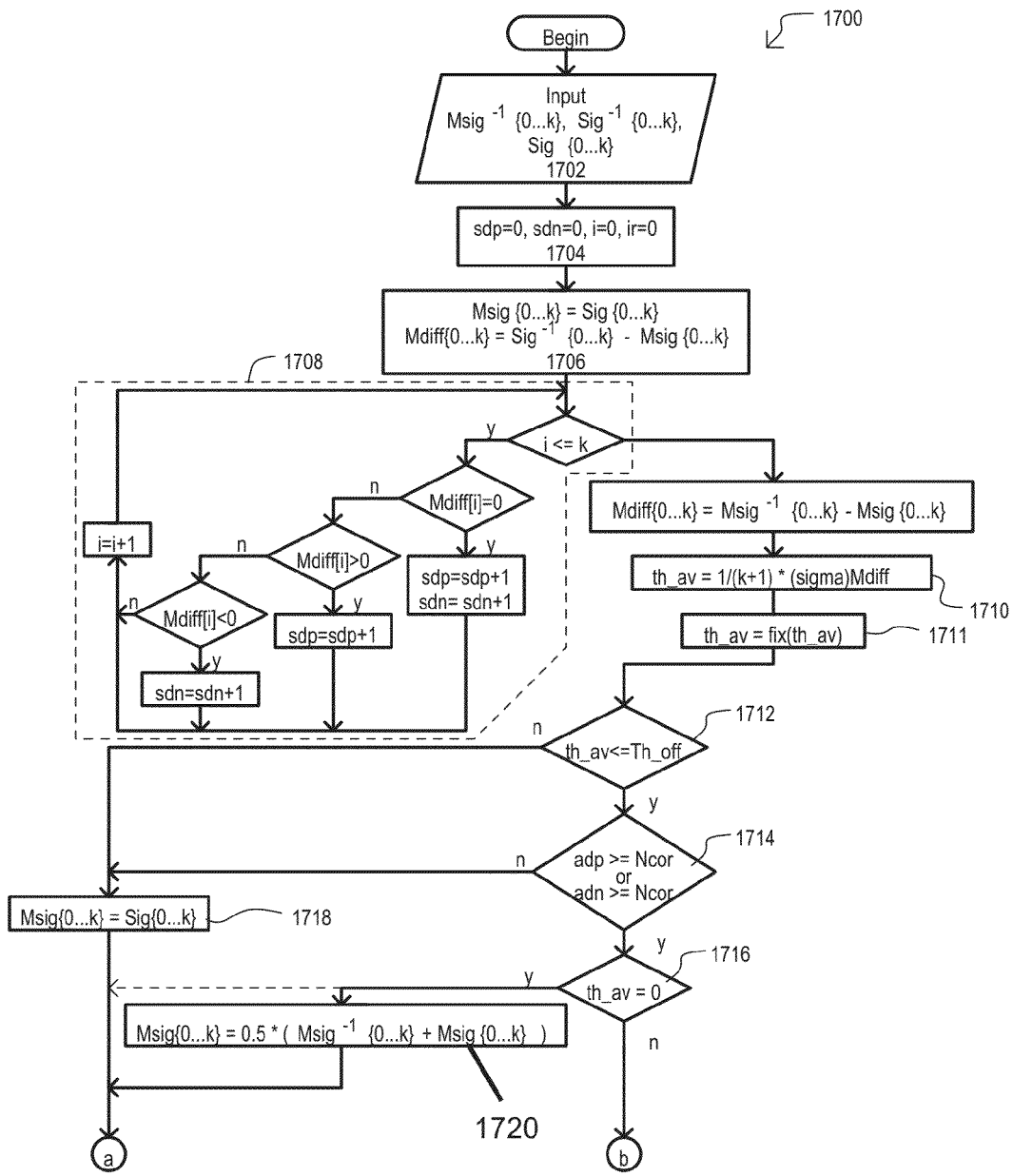
FIGS. 17A and 17B are flow diagrams of an adaptive jitter filter (AJF) according to an embodiment.
Figure 17B:
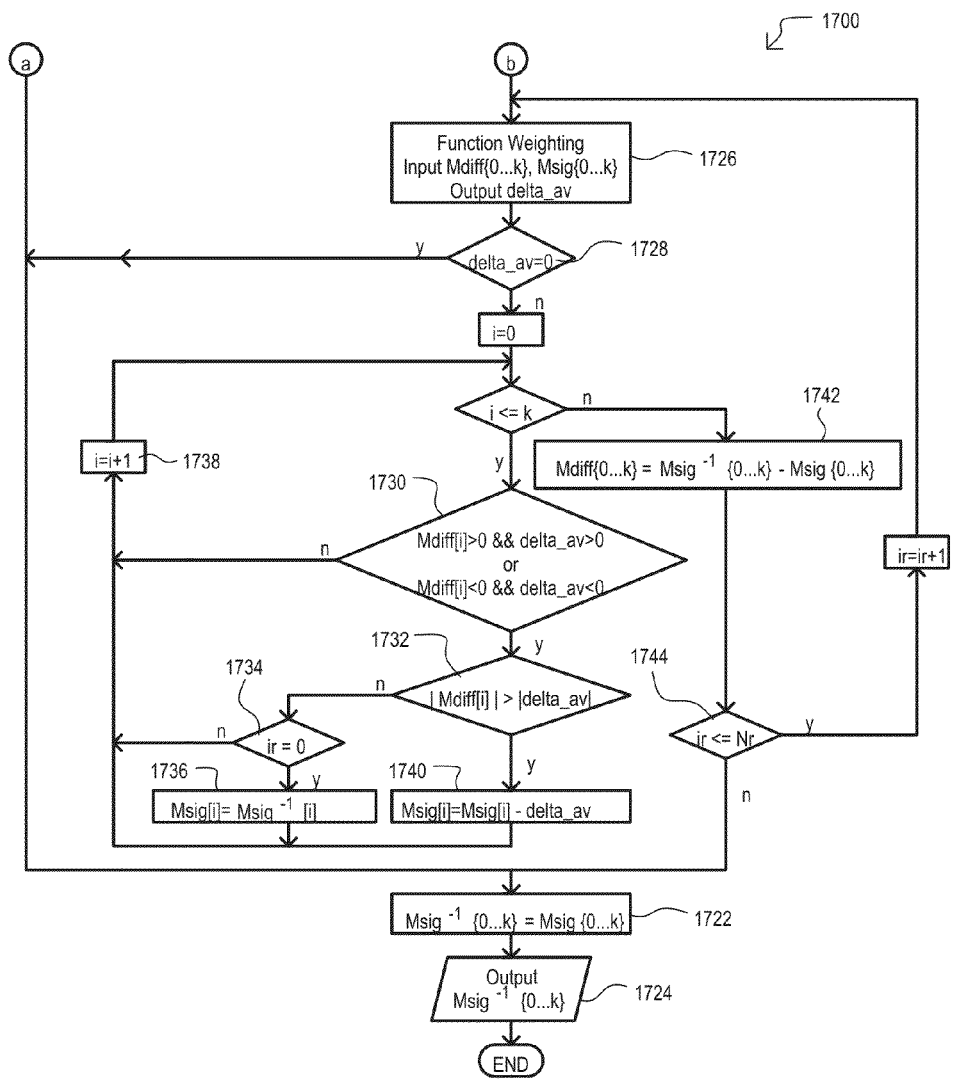

Referring now to FIGS. 17A and 17B, an AJF operation 1700 according to one embodiment is shown in flow diagram. An AJF can be one particular implementation of that shown as 1576 in FIG. 15. An AJF operation 1700 can perform filtering on a subset of electrodes based on average difference of such electrodes over time. FIGS. 17A and 17B are different portions of a flow diagram, with connections between the two shown as circled letters "a" and "b".

Referring first to FIG. 17A, an AJF operation 1700 can include inputting arrays of current signal values, and previously generated filtered signal values (1702). In the embodiment shown, this can include inputting values Msig$^{-1}$\{0 . . . k\} which can be previous filtered values generated by an AJF operation 1700 for an electrode set (e.g., a slot), values Sig$^{-1}$\{0 . . . k\} which can be previously input sense values for the same electrode set (which in some embodiments can include scaling and/or median filtering), and values Sig\{0 . . . k\} which can be current input sense values for the same electrode set.

Various values can be initialized to zero, including a positive disparity value sdp, a negative disparity value sdn, and iteration count values i and it (1704). As will be understood from the discussion below, a positive disparity value sdp can represent the degree of correlation in a positive change from a previous sense value set and current a sense value set. A negative disparity value sdn can represent a same correlation, but in the other (i.e., opposite polarity) direction.

An operation 1700 can determine a difference between previous sense signals and current sense signals (1706). In the embodiment shown, an array Mdiff\{0 . . . k\} can be created that holds such values (referred to herein as difference values).

An operation 1700 can then generate positive and negative disparity values utilizing such difference values (1708). In the embodiment shown, such an action can include determining if a difference between a previous sense value and its current level is positive, negative, or zero. A positive value will increase a positive disparity for the electrode set. Similarly, a negative value will decrease a negative disparity for the electrode set. In the embodiment shown, no difference in values (zero) can result in both positive and negative disparity values being increased.

Once disparity values have been generated, an operation can then calculate an average sum of the differences between sense signal sets (i.e., current and previous set) (1710). A function "fix" can remove a fractional part of a number (1711). Such an average value is shown as th_av in the embodiment of FIG. 17. If an average difference (th_av) is above a threshold value (n from 1712), filtering can stop, and current set of input values Sig{0 ... k} can be saved as filter values for a next filter operation and can be output as filtered values (1718, 1722, 1724). Such a threshold check can account from a multi-touch event occurring on the set of electrodes.

If an average difference (th_av) is below a threshold value (y from 1712), disparity values can be compared against correlation limits (1714). If either (i.e., positive or negative) disparity value is sufficiently small (n from 1714) filtering can once again end, with the current set of input values Sig{0 ... k} can be saved as filter values for a next filter operation and output as filtered values (1718, 1722, 1724).

If an average difference (th_av) is below a threshold value and correlation between sense signal sets is high (y from 1714) an average difference value th_av can be compared against a minimum value (in this case 0) (1716). If there is little difference between sense signal sets (y from 1716), a current signal sense value set and previous filtered sense value set can be averaged to create a current filtered sense value set (1720). This set can be saved as filter values for a next filter operation and output as filtered values (1722, 1724).

Referring now to FIG. 17B, when an average difference value (th_av) and disparity values are within predetermined ranges, an operation 1700 can call a weighting function 1726. A weighting function can increase sense values when a limited number of sense values in a set exceed a weighing threshold. A weighting function according to one particular embodiment will be described in more detail below. A weighting function can return a weighting value (delta_av) that can be used to weight sense values in a filtered set.

If a weighting function indicates no weighting (i.e., delta_av=0) (y from 1728), filtering can stop, and current set of input values Sig{0 ... k} can be saved as filter values for a next filter operation and output as filtered values (1722, 1724).

If a weighting function provides a weighting value (i.e., delta_av≠0) (n from 1728), an operation can selectively weight current sense values based on polarities of a difference value and the weighting value (delta_av). In particular, if a difference value for an electrode has the different polarity as the weighting value (n from 1730), the sense value may not be weighted.

However, if a difference value for an electrode has a same polarity than the weighting value (y from 1730), a magnitude of difference value can be compared to the weighting value (1732). If a magnitude of a difference is less than that of a weighting value (n from 1732), a multi-pass value can be checked to determine if the present operation is an initial pass (1734). If it is an initial weighting pass (n from 1734), an operation 1700 can continue to a next value of the set (1738). However, if it is a follow on weighting pass (y from 1734), a current value can be set to a previous filtered value, and an operation 1700 can continue to a next value of the set (1738). If the magnitude of a difference between sense values is greater than that of a weighting value (y from 1732), the weighting value can be subtracted from the current value (1740), and an operation 1700 can continue to a next value of the set (1738).

When all sense values of a set have been examined for weighting, a difference set can be created from the weighted values (1742). A multi-pass value can then be checked to determine if the present operation is a last pass (1744). If the operation is not a last pass (y from 1744), a weighting function can be called again with the updated values. If the operation is a last pass (n from 1744), a current set of filtered values can be saved as filter values for a next operation and output as filtered values (1722, 1724).

Figure 18A:
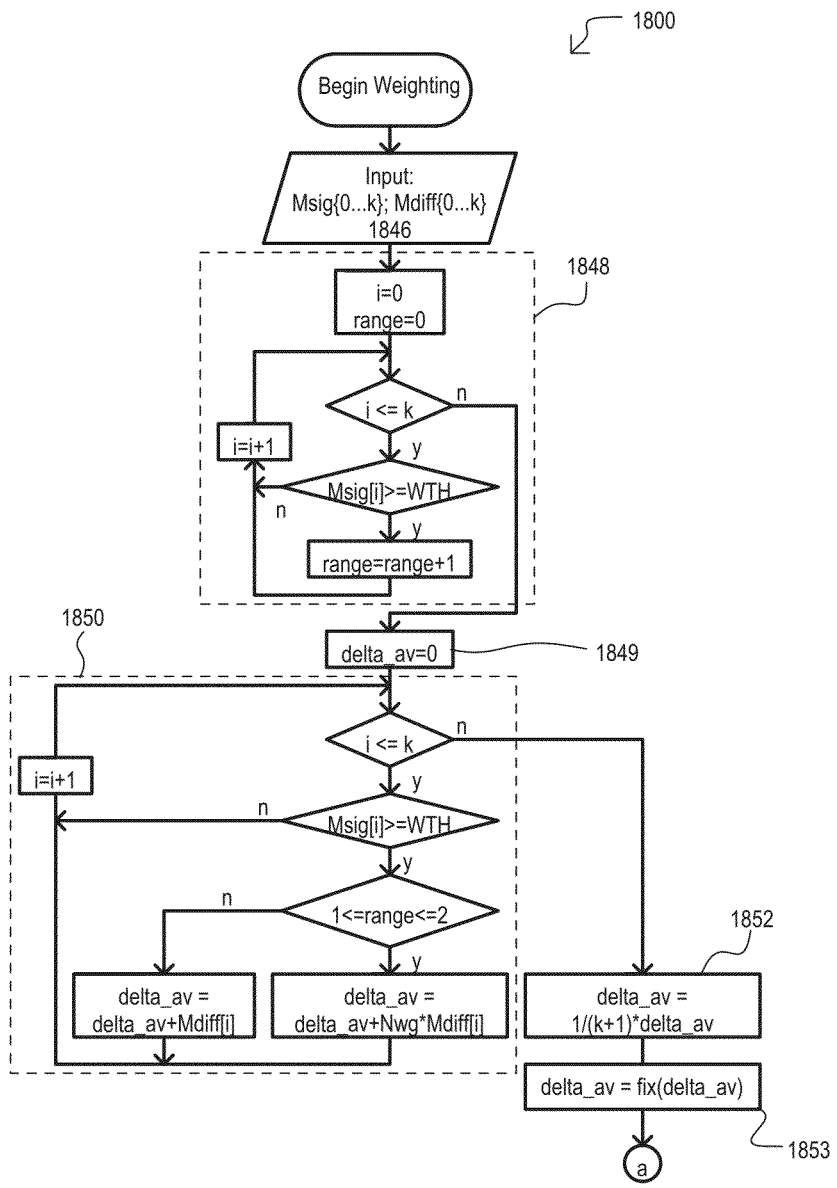
FIGS. 18A and 18B are flow diagrams of a weighting function that can be included in the AJF according to an embodiment.
Figure 18B:
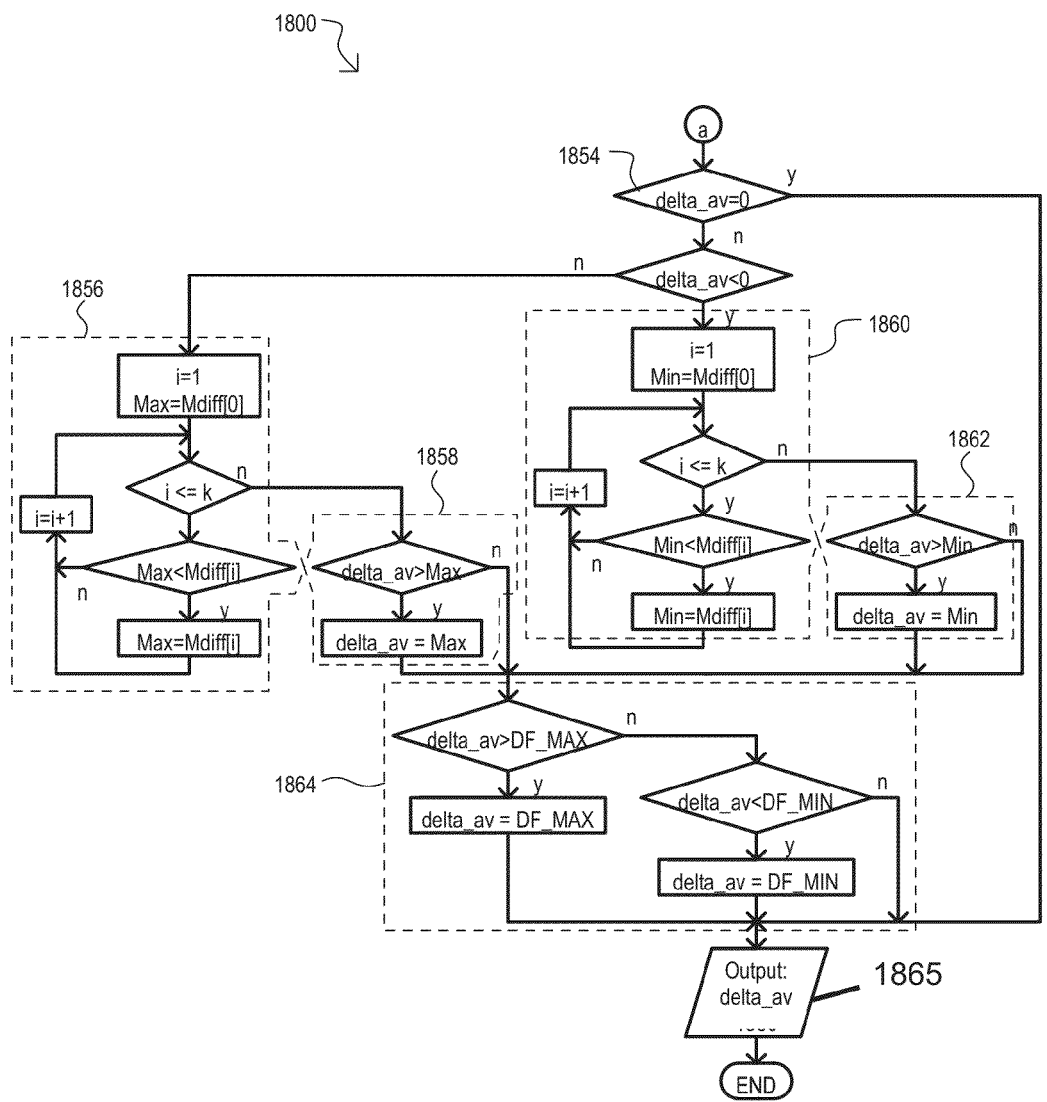

Referring now to FIGS. 18A and 18B, a weighting function 1800 according to one embodiment is shown in flow diagram. A weighting function 1800 can be one particular implementation of that shown as 1726 in FIG. 17. A weighting function 1800 can weight sense values in a set of electrodes when limited numbers of electrodes in the set exceed a weight threshold. FIGS. 18A and 18B are different portions of a flow diagram, with a connection between the two shown as circled letter "a".

Referring first to FIG. 18A, a weighting function 1800 can include inputting current filtered values Msig{0 ... k} and difference values Mdiff{0 ... k} (1846). A function 1800 can then examine a filtered value for each electrode in a set to see if it exceeds a weighting threshold (WTH). Each time a sense value exceeds a weighting threshold (WTH) a range value can be incremented (1848). Thus, a range value (range) can represent how many electrodes in a set exceed WTH.

Once a range value is established, a weighting value can be initialized (1849).

Each filtered value can be compared to a weighting threshold (1850). According to such a comparison, components of a resulting weighting value (delta_av) can be increased or decreased depending upon a range value. In the embodiment shown, if a range value outside of some minimum and maximum value (in the embodiment shown, less than or greater than two), a weighting component can be a difference value for the filtered value (delta_av=delta_av+Mdiff[i]). However, if a range value is within a predetermined range (in this embodiment, is "2"), a weighting component can be increased by multiplying by the difference value by a weighting factor (Nwg) (delta_av=delta_av+Nwg*Mdiff[i]).

Once all filtered values have been compared and components for the weighting value added up, an average of the values can be generated 1852. In the embodiment shown, fractional portions of weighting values can then be removed (1853).

Referring now to FIG. 18B, if a weighting value is zero (y from 1854) a weighting function can end, and the weighting value (zero) can be provided as an output weighting value (1865) (for use in the AJF). If a weighting value is positive, a maximum difference value (Max) from the set of difference values can be determined (1856). If a weighting value (delta_av) is greater than a maximum value (Max), the weighting value can be set to the maximum value (1858). In a similar fashion, if a weighting value is negative, a minimum value (Min) from the set of difference values can be determined (1860). If a weighting value (delta_av) is greater than a minimum value (Min), the weighting value can be set to the minimum value (1862).

A weighting value (delta_av) can then be bounded by a high limit value DF_MAX and low limit value DF_MIN (1864). If a weighting value (delta_av) is greater than high limit, it can be set to the high limit. Similarly, if a weighting value (delta_av) is less than low limit, it can be set to the low limit.

The resulting weighting value can then be provided as an output weighting value (1865) (for use in the AJF).

It is understood that FIGS. 17A to 18B show an AJF and weighting function according to a very particular embodiment. Alternate embodiments can realize such operations, or equivalent operation, with other circuits and/or architectures.

Figure 19:
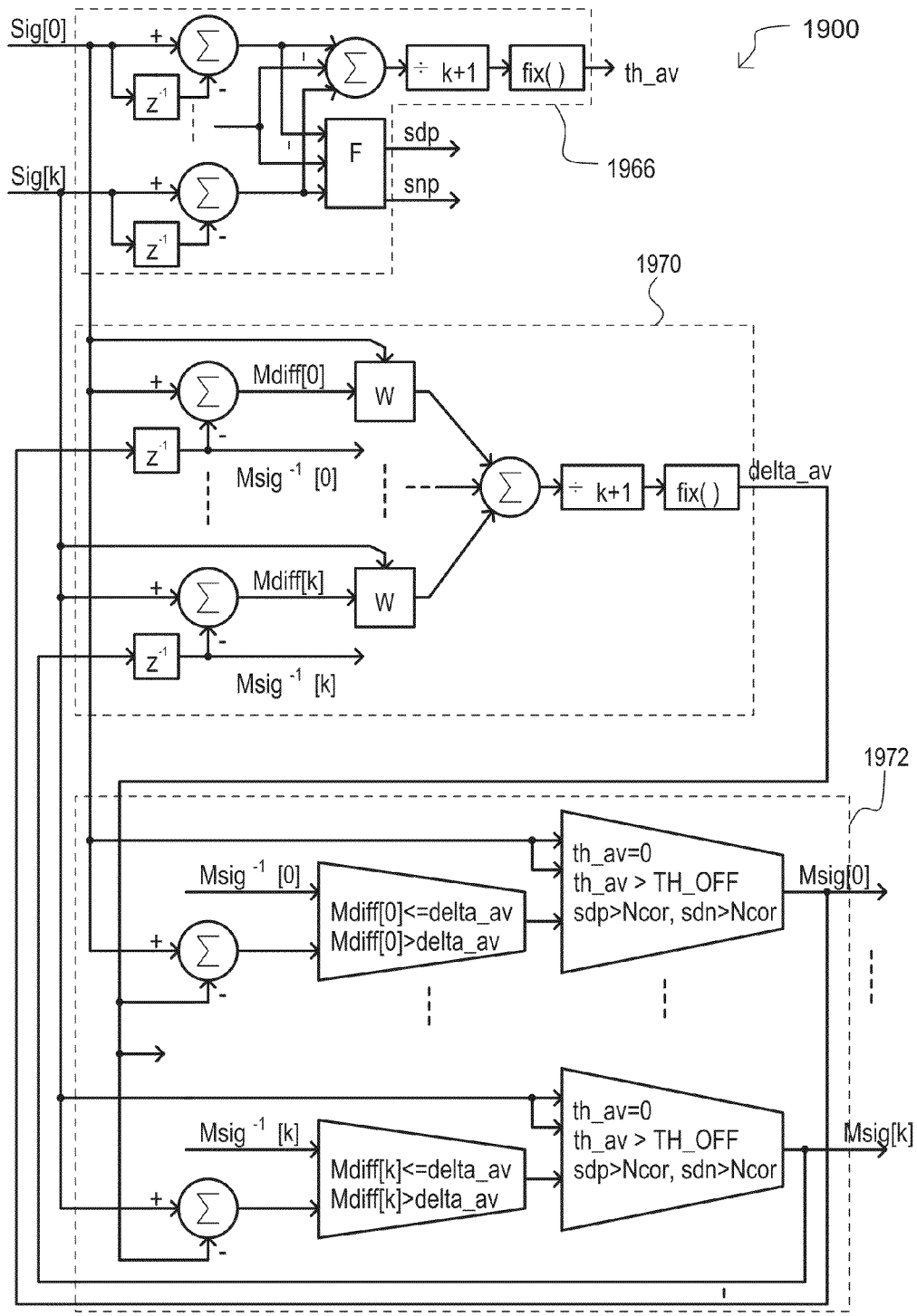
FIG. 19 is a diagram showing an AJF operation another to an embodiment.

FIG. 19 is a flow diagram showing another implementation of an AJF filter and weighting function like that shown in FIGS. 17A to 18B. FIG. 19 shows processing 1900 that includes a first section 1966 that can generate an average difference value (th_av), a positive disparity value (sdp), and negative disparity value (sdn), as described for FIG. 17A. A second section 1970 can generate a weighting value (delta_av) like that described for FIGS. 18A/B. A third section 1972 can generate filter output values as shown in FIG. 17B.

Figure 20:
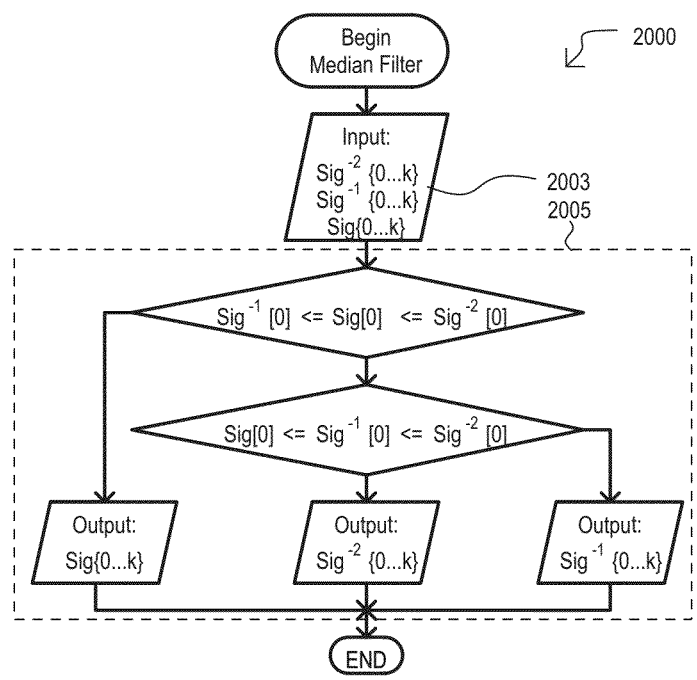
FIG. 20 is a flow diagram of a median filter that can be included in embodiments.

Referring now to FIG. 20, a median filter 2000 that can be included in the embodiments is shown in a flow diagram. A median filter 2000 can include inputting a set of sense values from consecutive sample periods (i.e., a sample window) (2003). In the particular embodiment of FIG. 20, a sample window is three. A median of the three values can be determined, and then provided as an output value (2005).

Embodiments can be utilized in capacitance sense systems to reduce the adverse affects of noise local to a subset of all electrodes, such as that arising from external noise source.

Embodiments can improve capacitance sensing of a device when it is coupled to a charging device by filtering charger noise coupled to a touch object (e.g., finger).

The frequency hopping algorithm described above can be improved upon, possibly improving stability and performance even for noise below 3 Vp-p within a range of 1-200 kHz square wave noise. The embodiments described herein may be used to meet device requirements for charger noise. One of the improvements may include modifying a state machine to implement an additional listening method independently checks actual raw counts values on each sensor to decide if a frequency change is needed. Other methods in the embodiments described below may also be used to improve baseline updates for all available configurations to maintain the baselines up to date with possible changes in the device's environment.

Generally, the embodiments described above perform noise listener scanning before normal scanning as illustrated in FIG. 1 and FIG. 2. In order to eliminate the listener's sensitivity to LCD common node noise, a common node filter is applied to the listener data. After filtering, the noise detector defines the noise level (based on thresholds and timeout technique). If charger noise is not detected then the scanning and processing path is not charged, as illustrated in the standard scan 104, 204. The normal scanning (e.g. with 8 sub-conversions) with pipeline filtering, CMF, baseline and difference calculation are typically performed, as shown in 212 and 228 of FIG. 2. If the acceptable charger noise is detected (e.g., Rx channel is not saturated and the system SNR is decreased but it is greater than 1-2) then the normal scanning time is increased (e.g., twice as many conversions or the like), as shown in the extended scan 114, 206. The pipeline filtering (with CMF excluded), may perform median filtering 216-0, non-linear noise filtering 216-1, as well as baseline and difference calculation 228, as illustrated in FIG. 2. If a non-acceptable noise is detected (e.g., Rx channel is saturated and the system SNR is less than 1), then a charger noise alarm flag is defined by the noise alarm 218 and the system tries to solve the problem by charger noise scanning and processing path.

The idea of frequency hopping is to detect the noise which exceeds some threshold and switch to different frequency which has the noise below threshold. If there's no one frequency in a list which meets noise requirements than it will pick the most quiet one and operate on it. The system may listen to the noise and turn on filtering in case of exceeding some other acceptable noise threshold. The combination of noise listening and filtering with frequency hopping can use three different thresholds: 1) a first noise threshold where the noise may be filtered with filters; 2) a second noise threshold where the noise cannot definitively be filtered by standard filters and may benefit from a frequency change; and 3) a third noise threshold where the noise is considered excessive noise and where the flag is sent to the host that the noise cannot be filtered.

Figure 23:
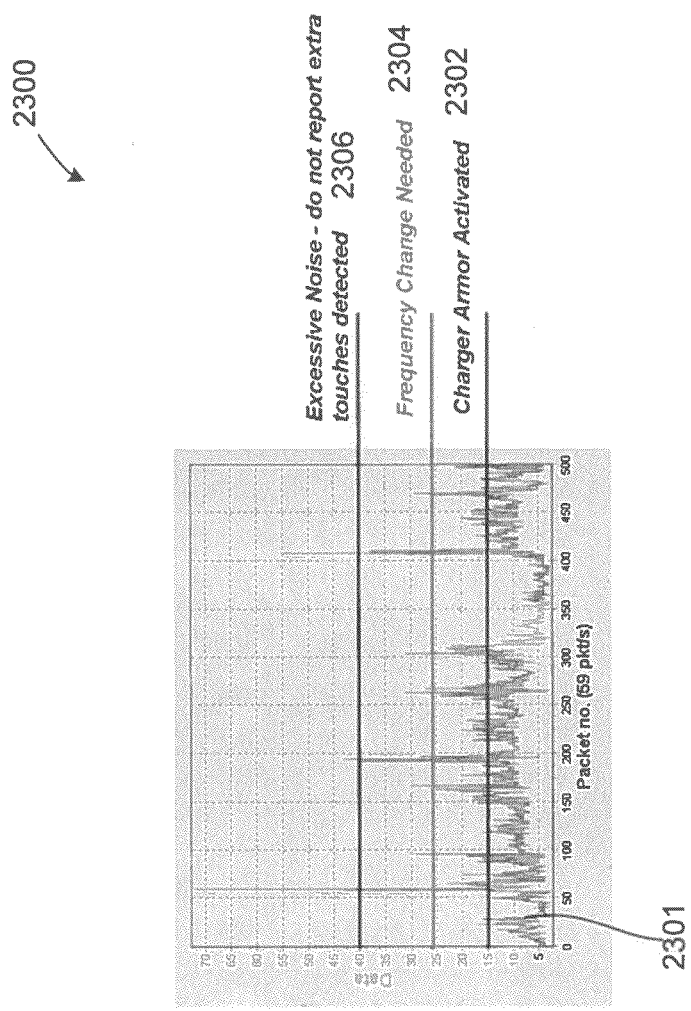
FIG. 23 is a graph of detected noise and three noise thresholds according to one embodiment.

FIG. 23 is a graph 2300 of detected noise 2301 and three noise thresholds 2302-2306 according to one embodiment. The detected noise 2301 is shown as data values (also referred to as counts) in packets being sent to the host. As shown in the FIG. 23, the detected noise 2301 exceeds a first noise threshold 2302 at which charger armor feature is activated. The charger armor feature refers to the different combination of techniques described herein that identify, define, and filter the detected noise on the device. The phrase "charger armor feature" is used as a matter of convenience, but could include any one of the different combination of listening, detecting, and filtering techniques described herein. The detected noise 2301 may also exceed a second noise threshold 2304 at which charger armor filtering is activated and a frequency change is needed. The combination of frequency hopping with the charger armor filtering may result in better noise suppression. The detected noise 2301 may also exceed a third noise threshold 2306 at which the detected noise 2301 is considered excessive noise. The host can ignore the data (e.g., detected touches) during this condition.

Figure 24:
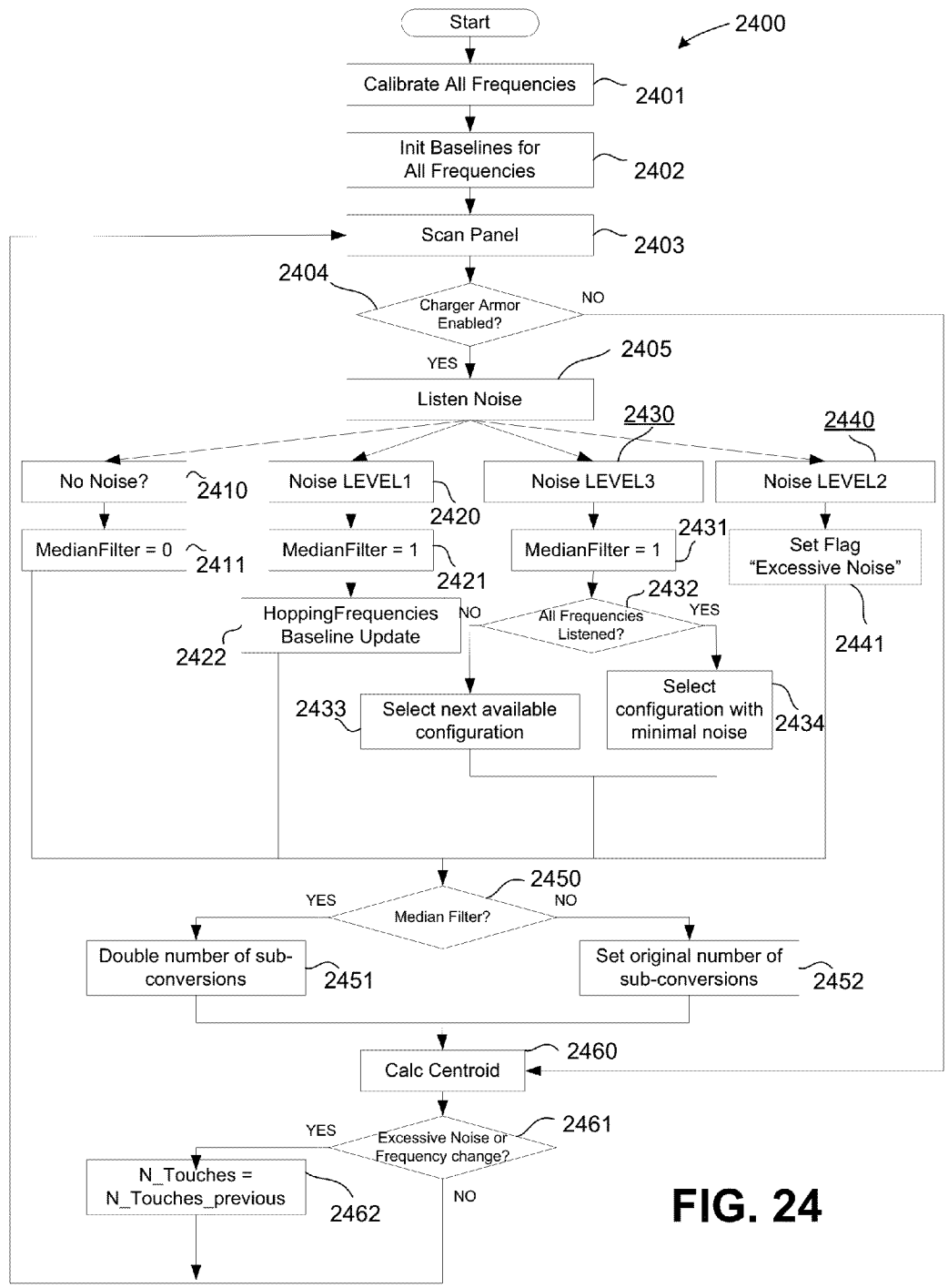
FIG. 24 is a flow chart illustrating a method of noise suppression according to one embodiment.

FIG. 24 is a flow chart illustrating a method 2400 of noise suppression according to one embodiment. The method 2400 may be performed by processing logic that may comprise hardware (circuitry, dedicated logic, etc.), software (such as is run on a general purpose computing system or a dedicated machine), firmware (embedded software), or any combination thereof. In one embodiment, the controller 330, 430, 530 and 630 of FIGS. 3, 4, 5 and 6 performs some of operations of method 2400. Alternatively, other components of the capacitance sensing system 300, 400, 500, and 678 of FIGS. 3, 4, 5, and 6 can perform some or all of the operations of method 2400.

Referring to FIG. 24, the method 2400 begins with calibrating all available frequencies (block 2401), and initializing baselines for those frequencies (block 2402). Next, the processing logic scans the panel (block 2403) at a specified operating frequency. Next, processing logic determines if the charger armor feature of the device is enabled (block 2404). If not, the processing logic proceeds to calculate a centroid (block 2460) as described below. However, if at block 2404 the charger armor feature is enabled, the processing logic listens to the noise (block 2405). The detected noise can be categorized into four levels: 1) "No Noise"—no noise is detected (e.g., noise is below the first noise threshold 2302); 2) "Noise Level 1"—charger armor filter needed (noise is above the first noise threshold 2302); 3) "Noise Level 3"—frequency change is needed (noise is above the second noise threshold 2304); and 4) "Noise Level 2"—excessive noise detected (noise is above the third noise threshold 2306).

If the processing logic determines that the noise is in the "No Noise" level, in which the noise is less than the first noise threshold (block 2410), the processing logic disables a median filter (block 2411). If the processing logic determines that the noise is in the "Noise Level 1" (block 2420), the processing logic enables the median filter (block 2421), and may perform a baseline update on the hopping frequencies (block 2422). If the processing logic determines that the noise is in the "Noise Level 3" (block 2430), the processing logic enables the median filter (block 2431), and determines whether all frequencies have been listened to (block 2432). If not all the frequencies have been listened to at block 2432, the processing logic selects a next available configuration (block 2433). When all the frequencies have been listed to at block 2432, the processing logic selects the configuration with the lowest noise (block 2434). If the processing logic determines that the noise is in the "Noise Level 2" (block 2440), the processing logic sets the flag "Excessive Noise" (block 2441).

Next, the processing logic determines if the median filter is enabled (block 2450). If not, the processing logic sets the original number of sub-conversions (block 2452), as described above in the normal scanning. However, if the median filter is enabled, the processing logic increases the number of sub-conversions (block 2451). For example, the number of sub-conversions can be doubled as described above in the extended scanning.

Next, the processing logic calculates a centroid (block 2560) of the data that may or may not have been filtered. In yet a further embodiment, as depicted, the processing logic can determine if the detected noise is excessive in "Noise Level 2" (block 2440), or the frequency change is needed in "Noise Level 3" (block 2430) (block 2461). If not, the processing logic returns to scan the panel at block 2403. If yes, the processing logic assigns the previous number of touches to a current number of touches (block 2462). This may operate as a debounce feature that may prevent reaction to glitches in the noise due to a single sample having excess noise. Also, the debounce feature may be used to track the number of touches when transitioning to a new frequency.

Figure 25:
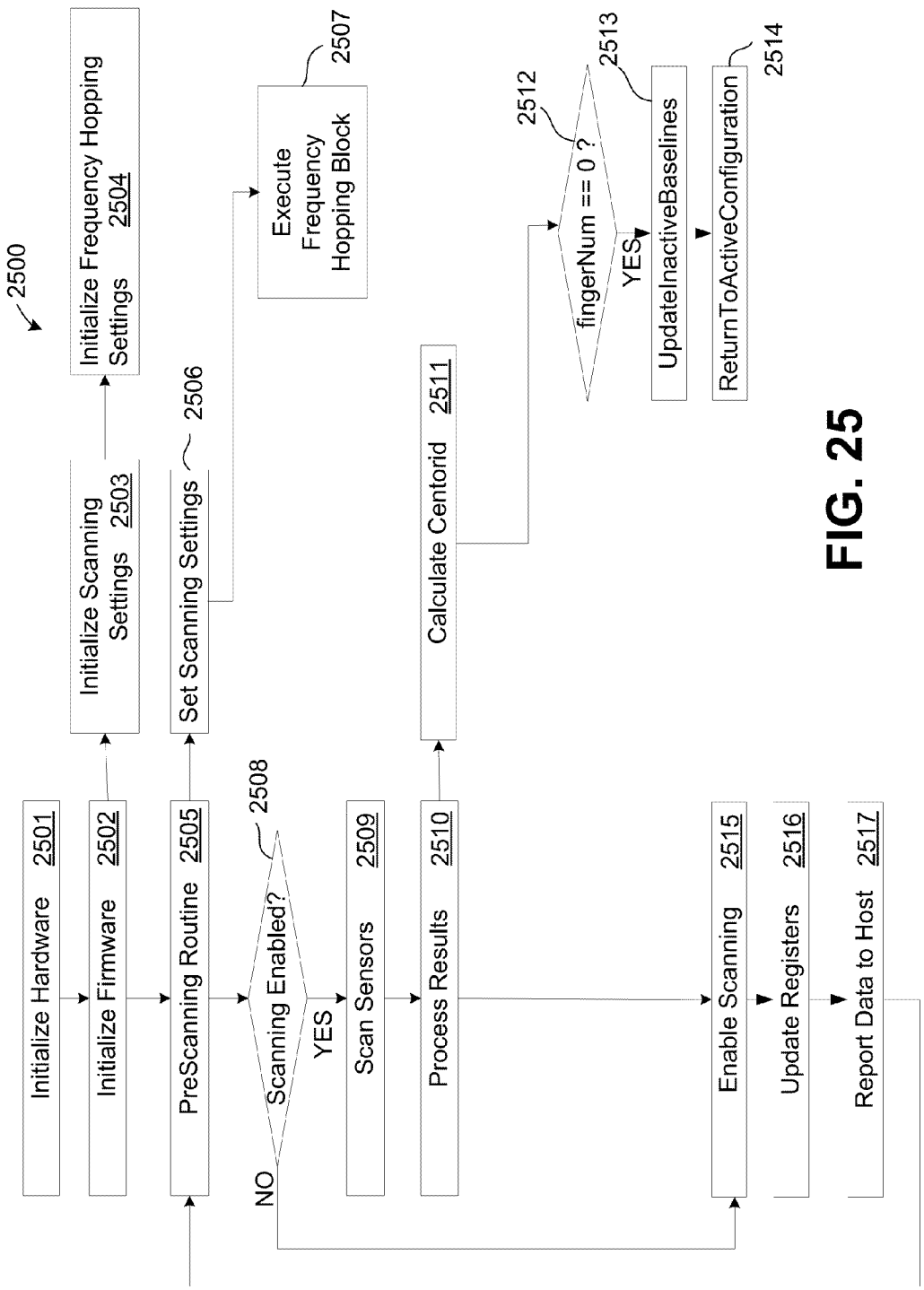
FIG. 25 is a flow chart illustrating a method of noise suppression with frequency hopping according to one embodiment.

FIG. 25 is a flow chart illustrating a method of noise suppression with frequency hopping according to one embodiment. The method 2500 may be performed by processing logic that may comprise hardware (circuitry, dedicated logic, etc.), software (such as is run on a general purpose computing system or a dedicated machine), firmware (embedded software), or any combination thereof. In one embodiment, the controller 330, 430, 530 and 630 of FIGS. 3, 4, 5 and 6 performs some of operations of method 2500. Alternatively, other components of the capacitance sensing system 300, 400, 500, and 678 of FIGS. 3, 4, 5, and 6 can perform some or all of the operations of method 2500.

Referring to FIG. 25, the method 2500 begins with initializing hardware (block 2501) and initializing firmware (block 2502). Initializing the hardware may include setting up the circuitry used to scan the electrodes of the sense network, such as the switching circuits, ADC, signal generators, etc. As part of initializing the firmware, the processing logic can assign global variables, initialize scanning settings (block 2503) and initialize frequency hopping settings (block 2504). Initializing the scanning settings at block 2503 may include, for example, setting the number of scanning cycles (e.g., number of sub-conversions) to be performed, which electrodes are to be scanned, a scan order, initialize any variables and thresholds associated with scanning, or the like. Initializing the frequency hopping settings at block 2504 may include, for example, setting the available number of frequencies, variables and thresholds associated with the frequency hopping algorithm, or the like. Next, the processing logic performs a pre-scan routing (block 2505) in which the processing logic sets the scanning settings (block 2506), and executes the frequency hopping algorithm (block 2507). Also, as part of the pre-scanning routine, the processing logic can scan the electrodes to obtain baselines levels for the electrodes. The baselines are measured when there is no touch on the device and are used to determine a change from the baseline (raw data) is above a touch threshold. The pre-scan routing may include other systems operations as would be appreciated by one of ordinary skill in the art having the benefit of this disclosure.

Next, the processing logic determines if the scanning is enabled (block 2508). If not, the processing logic enables the scanning (block 2515), updates the registers (block 2516), and reports data to a host (block 2517), returning to the pre-scan routine at block 2505. When the scanning is enabled at block 2508, the processing logic scans the sensors (block 2509) and processes the results (block 2510). As part of processing the results, the processing logic can determine a difference between the raw counts and the baseline. The raw counts may be a digital value that represents the capacitance measured on the electrodes. Also, as part of processing the results, the processing logic calculates the centroid (block 2511). The centroid may determine a coordinate location of the touch, such as the X/Y coordinates of the touch. This may be reported in terms of pixels, or in terms of a coordinate system mapping of the touch surface. The processing logic may also perform filtering when certain conditions apply, as described herein.

In one embodiment, as part of processing the results, the processing logic may also determine if the number of fingers proximate to the sense network is greater than zero (block 2512). If so, the processing logic updates the inactive baselines (block 2513) and returns to active configuration (block 2514), such as returning to block 2515. The inactive baseline updates may update the baseline values so that they are adjusted for current conditions, such as the noise environment in which the device is currently operating. In one embodiment, a counter may be used for baseline updates. When the counter expires the updates can be designated as inactive and need to be updated when there are no touches. The counter value may be a programmable value based on the design specifications.

At block 2515, the processing logic can have an XY position (centroid) or a flag for excessive noise, and can determine if the scanning is enabled (block 2514), can update the registers (block 2516), and report the data to the host (block 2517). In one embodiment, the processing logic sends an interrupt to the host to let a driver of the operating system of the host know that there is new data. In the interim, the processing logic can return to the pre-scanning routine at block 2505 to perform another scan. In short, the method can check for noise, scan, calculate a position, and report to the host over and over while the method is operating.

It should be noted that in one embodiment, the method 2500 is performed without blocks 2504, 2507, 2512, 2513, and 2514, as described above. In another embodiment, the method 2500 is performed with blocks 2504 and 2507, but without blocks 2512-2514. In another embodiment, the method 2500 is performed with blocks 2512-2514 and without blocks 2504 and 2507.

The flow chart of FIG. 25 shows how the frequency hopping algorithm can be implemented in the architecture of a capacitive touch screen controller. In one embodiment, the capacitive touch screen controller is the TrueTouch® capacitive touchscreen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touchscreens up to 5 inches, supports leading operating systems, and is optimized for low-power multi-touch gesture and all-point touchscreen functionality. Alternatively, the frequency hopping features may be implanted in other touchscreen controllers, or other touch controllers of touch sensing devices. In one embodiment, the frequency hopping features may be implanted with the charger armor features for better noise suppression, such as from chargers.

In one embodiment, the processing logic can force a frequency hop trigger on an excessive noise activation as specified by one of the noise thresholds—frequency change activation threshold. Sometimes the noise listener cannot detect the exact condition when the false touch is going to happen and a frequency change is needed. This may be caused by the noise listener's implement in some device. For example, the noise listener's output may oscillate near the frequency change activation threshold. Even though the output may not reach the frequency change activation threshold, there may be sufficient noise to trigger a false touch. In one embodiment, the frequency change activation threshold may be lowered. However, lowering the frequency change threshold of noise listener may cause the state machine to become unstable by switching to a different frequency without finding a frequency at which the noise is quieter. In another embodiment, instead of lowering the change frequency threshold, the change frequency threshold can be set high enough to not cause continuous unstable hopping and the state machine algorithm can indicate when the frequency configuration needs to be changed, as described in more detail below. In one embodiment, this algorithm may check most or all capacitive electrodes of the sense network and count how many of the electrodes have a signal close to a finger threshold without exceeding the finger threshold. If the number of capacitive electrodes is large enough, but the listener does not reach the frequency change threshold, the algorithm can force a frequency change, such as described and illustrated in FIG. 26.

In another embodiment, the processing logic counts a number of active electrodes among the electrodes (e.g., capacitive sense elements) of the sense network. The active electrodes are those whose respective signal is greater than a minimum touch signal value and less than a touch threshold. The processing logic initiates a frequency change to another one of the available operating frequencies when the number is greater than a threshold number. In yet a further embodiment, the processing logic determines the minimal signal value based on a signal value of one or more conductive object detected proximate to the electrodes.

Figure 26:
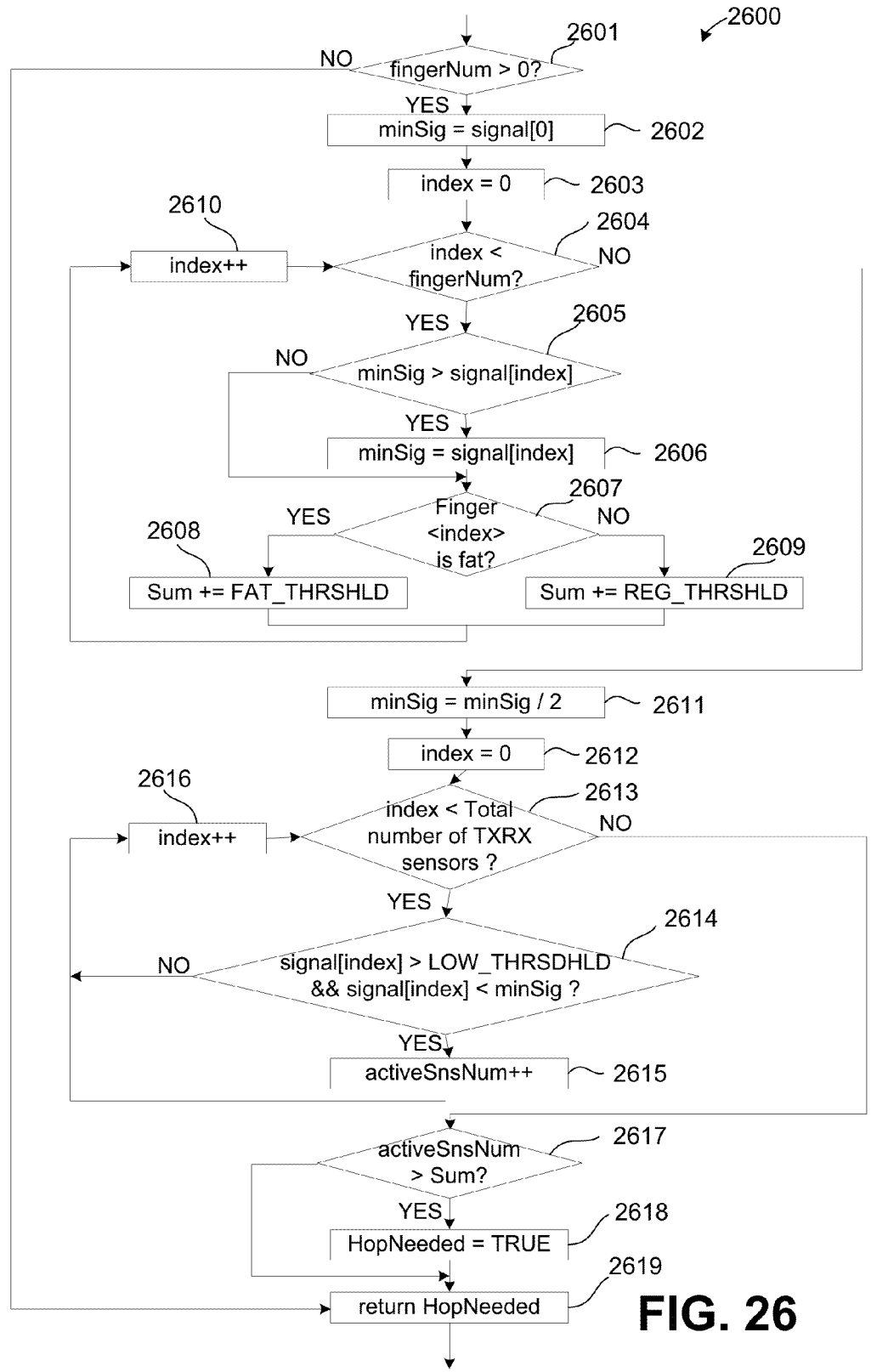
FIG. 26 is a flow chart that illustrates a method of forcing a frequency change according to one embodiment.

FIG. 26 is a flow chart illustrates a method 2600 of forcing a frequency change according to one embodiment. The method 2600 may be performed by processing logic that may comprise hardware (circuitry, dedicated logic, etc.), software (such as is run on a general purpose computing system or a dedicated machine), firmware (embedded software), or any combination thereof. In one embodiment, the controller 330, 430, 530 and 630 of FIGS. 3, 4, 5 and 6 performs some of operations of method 2600. Alternatively, other components of the capacitance sensing system 300, 400, 500, and 678 of FIGS. 3, 4, 5, and 6 can perform some or all of the operations of method 2600.

Referring to FIG. 26, the method 2600 begins with determining if a number of touches is greater than zero (block 2601). If the number of touches is greater than zero, the processing logic initializes or resets a minimal signal value (minSig) (block 2602) and sets an index to zero (block 2603). Then for each of the touches detected (fingerNum), the processing logic determines which of the touches is the smallest. For example, a pinkie finger may produce a smaller count than a thumb. By finding the smallest touch among multiple touches, the processing logic can detect that signals above that level would be considered a touch, where signals below that level will likely be noise, such as from a charger. In the depicted embodiment, the processing logic determines the minimal signal for a touch by determining if the index is less than the number of touches detected (block 2604), and determining if the minimum touch signal value is greater than indexed touch's signal (block 2605). If so, the touch's signal becomes the signal (block 2606); otherwise, the minimum touch signal value stays the same. Also, the processing logic may determine if the touch is considered to be a large touch (referred to a fat finger) (block 2607).

A touch may be considered large using a specified number of electrodes that are activated by the touch. For example, if a touch panel included 200 sensors (200 intersections of RX electrodes and TX electrodes), a finger would cover more than a few of the sensors, such as ten or 15. A thumb may even cover 20 sensors. A programmable value may be set for the number of active sensors are needed for the touch to be considered a large touch or not. Finger size may impact the determination of noise because charging noise is noise that is localized. It is localized to the area where the touch occurs, such as on the RX lines. For example, if the touchscreen on a mobile phone is touched on the bottom of the touchscreen and the RX channels are disposed horizontally, only the bottom RX lines will have noise, and there will be less noise or no noise at the top portion of the touchscreen. In this case, if the finger is a fat finger, such as a thumb, more RX lines are covered with the touch, and more noise may be introduced.

If at block 2607 the touch is considered large, a specified fat threshold (Fat_THRSHLD) is added to a sum (block 2608); otherwise, a regular threshold is added to the sum (block 2609). The processing logic repeats this process for each touch, by incrementing the index (block 2610) and determining whether the index is less than the number of touches (block 2604).

Once the minimum touch signal value is determined from blocks 2604-2610, the processing logic reduces the minimum touch signal value by a specified amount. In the depicted embodiment, the processing logic divides the minimum touch signal value by half (block 2611). The processing logic sets an index to zero (block 2612), and determines whether the index is less than the total number of intersections of the electrodes (TX/RX sensors) (block 2613). If so, the processing logic determines how many of the sensors are active by determining if the touch signal is more than a low threshold and the signal is less than the minimum signal (block 2614). If not, the index is incremented (block 2616), and the processing logic returns to block 2613. If yes at block 2614, the processing logic increments a counter value of the number of active sensors (block 2615), and then increments the index at block 2616, returning to block 2613.

Once the total number of sensors has been evaluated, the processing logic determines if the number of active sensors is greater than the sum as set in blocks 2608 and 2609. If yes, the processing logic forces a frequency change using the frequency hopping algorithm (block 2618) and returns the hop needed status (e.g., TRUE), and the method 2600 ends. If no at block 2617, the processing logic returns that hop needed status (e.g., FALSE), and the method 2600 ends.

In other embodiments, the processing logic can detection a condition when the frequency change is needed even when the detected noise does not reach the change frequency threshold. For example, there may be 100 of 200 sensors that are activated, but the detected noise does not trigger the change frequency condition. The processing logic calculates how many sensor in the whole panel have this type of noise and the processing logic may previously define, based on user input for example, how low or how high the margin should be for the signal. The margin can make it so the processing logic does not consider when the signal is above a certain threshold because it might be a touch, and it doesn't want to consider signals where one or two sensors are activated since this may be just random noise of the device. By detecting the signal within the margin, the processing logic can force a frequency change even when the noise does not rise to the level of the change frequency condition, when the noise signal is above the frequency change threshold. The margin can be determined based on the minimum signal by evaluating the signals of the number of touches detected and determining which is the smallest. This way any signal greater than the minimum signal is likely considered a touch. The minimum signal may be reduced further by another specified amount to define the one threshold. The other threshold may be set to be exclude regular noise of the system, and not localized noise like from a charger.

In the depicted embodiment, this algorithm has few configurable compile time defines such as: 1) FAT_THRSHLD—is a value to be added to wSum if finger is fat (large touch). Sometimes the value is around double finger threshold value. 2) REG_TH—is a value to be added to wSum if finger is not fat (regular touch). Usually the value is around finger threshold value. 3) LOW_TH—is a value of minimum touch signal value to be counted as active. This value should be tuned separately for each panel. This value may be estimated based on a visual assessment of the noise in the sense network.

Figure 27A:
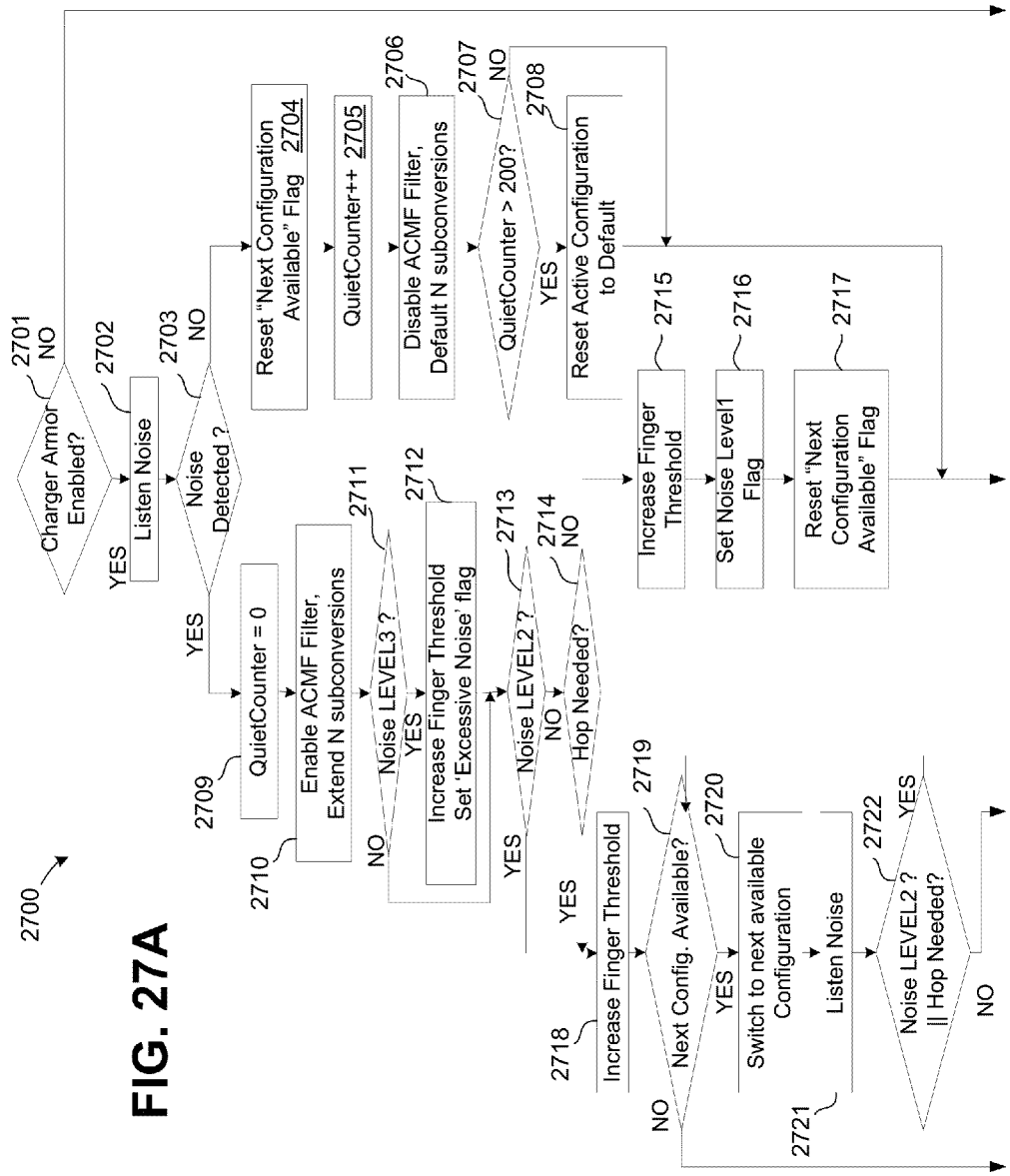
FIGS. 27A and 27B are a state machine for charger armor and frequency hopping according to one embodiment.
Figure 27B:
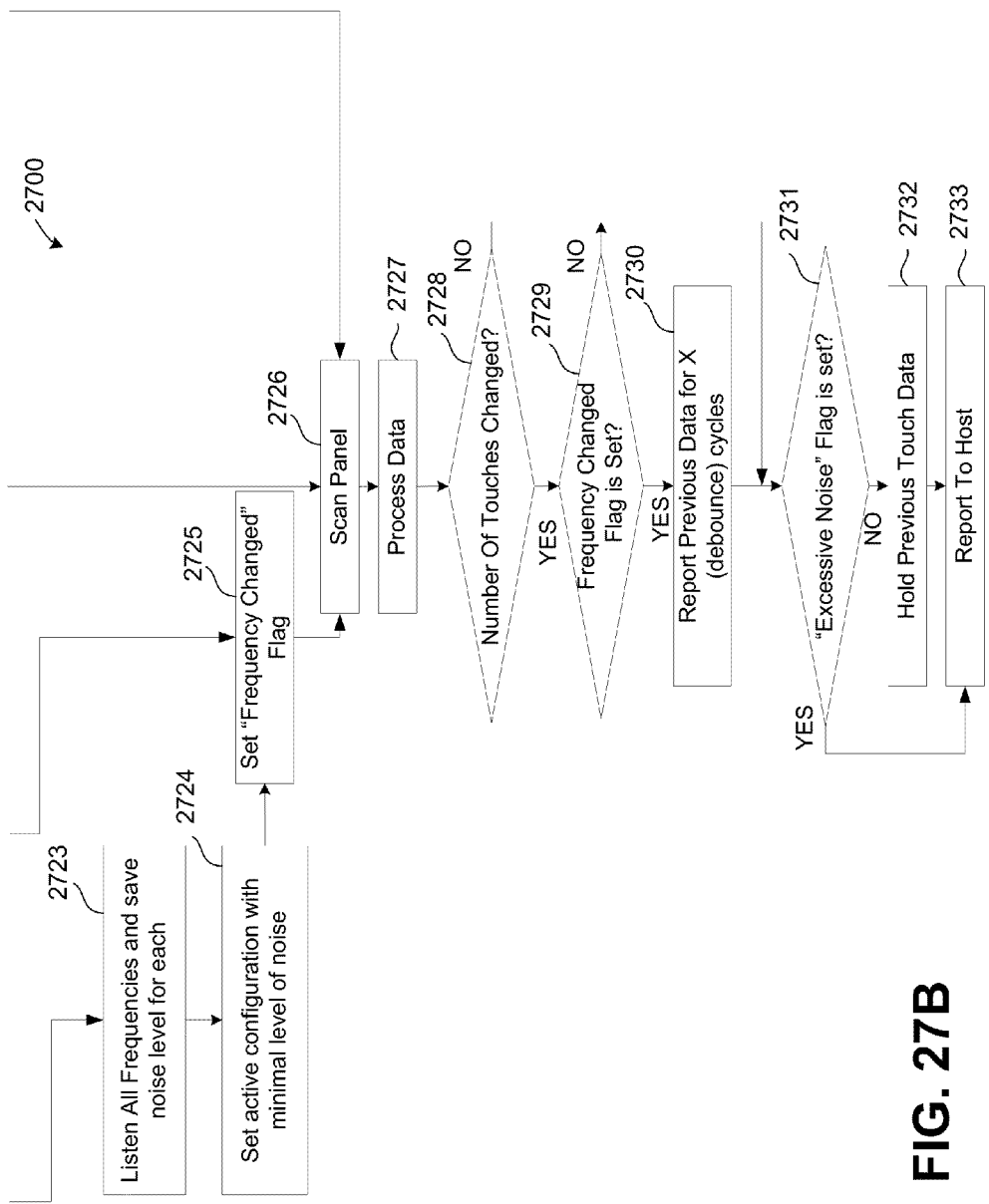

FIGS. 27A and 27B are a state machine 2700 for charger armor and frequency hopping according to one embodiment. The state machine may be implemented by processing logic that may comprise hardware (circuitry, dedicated logic, etc.), software (such as is run on a general purpose computing system or a dedicated machine), firmware (embedded software), or any combination thereof. In one embodiment, the controller 330, 430, 530 and 630 of FIGS. 3, 4, 5 and 6 performs the operations of the state machine 2700. Alternatively, other components of the capacitance sensing system 300, 400, 500, and 678 of FIGS. 3, 4, 5, and 6 can perform some or all of the operations of the state machine 2700.

Referring to FIGS. 27A and 27B, the processing logic determines if the charger armor is enabled 2701. If so, the processing logic listens to the noise (block 2702). At block 2703, the processing logic determines if noise is detected. If noise is detected at block 2703, the processing logic sets a quiet counter to zero (block 2709), enables an adaptive common mode filter (ACMF) and extends the number of scans (e.g., number of sub-conversions N) (block 2710). The processing logic determines if the detected noise at the "Noise Level 3" (block 2711). If so, the processing logic increase a finger threshold and sets the excessive noise flag (block 2712). If at block 2711, the noise is not at the "Noise Level 3," the processing logic does not increase the finger threshold and does not set the excessive flag, skipping block 2712. Next, the processing logic determines if the detected noise at the "Noise Level 2" (block 2713). If so, the processing logic increases the finger threshold (block 2718). If the detected noise is not at the "Noise Level 2," the processing logic determines if a hop is needed (block 2714). If so, the processing logic increases the finger threshold at block 2718. At block 2719, the processing logic determines if there is another configuration available. If so, the processing logic switches to the next available configuration (block 2720, and listens to the noise (block 2721). The processing logic determines if the noise is at the "Noise level 2" or if the hop is needed (block 2722). If so, the processing logic returns to the next configuration available at block 2719. If no at block 2722, the processing logic listens to the all the frequencies and saves each noise level for each frequency (block 2723), and sets the active configuration with the minimal level of noise (block 2724). Also, if at block 2719 if there is no more configurations available, the processing logic passes the operations 2720-2722 and listens to the all the frequencies and saves each noise level for each frequency (block 2723), and sets the active configuration with the minimal level of noise (block 2724). In either case, the processing logic sets the "Frequency Changed" flag (block 2725) and the processing logic proceeds to block 2726 to perform a scan of the panel.

Returning to block 2714, if the processing logic determines that a frequency hop is not needed, the processing logic increases the finger threshold (block 2715), sets the "Noise Level 1" flag (block 2716), and resets the "Next Configuration Available" flag (block 2717), and the processing logic proceeds to block 2726 to perform a scan of the panel.

Returning to block 2703, if the processing logic does not detect noise, the processing logic resets the "Next Configuration Available" flag (block 2704), increments the quite counter (block 2705), disables the ACMF filter and sets the default number of scans (e.g., number of sub-conversions N) (block 2706). The processing logic determines if the quiet counter is greater than a specified threshold value (e.g., 200). If so, the processing logic resets the active configuration to the default configuration (block 2708) and the processing logic proceeds to block 2726 to perform a scan of the panel. Otherwise, if no at block 2707, the block 2708 is skipped, and the processing logic proceeds to block 2726 to perform a scan of the panel.

Returning back to block 2701, if the processing logic determines that the charger armor is not enabled, the processing logic proceeds to block 2726 to perform a scan of the panel.

At block 2726, the processing logic performs the scan of the panel. Next, the processing logic processes the data (block 2727). The processing logic determines whether the number of touches has changed (block 2728). If so, the processing logic determines if the "Frequency Changed" flag is set (block 2729). If so, the processing logic reports the previous data for a specified number (X) of debounce cycles for the debounce feature (block 2730). If at block 2728 the answer is no, the processing logic skips block 2729 and 2730. If at block 2729 the answer is no, the processing logic skips block 2730.

Next, processing logic determines if the "Excessive Noise" flag is set (block 2731). If so, the "Excessive Noise" flag is reported to the host (block 2733). If not at block 2731, the processing logic holds the previous touch data (block 2732) and reports to the host (block 2733). The state machine 2700 may return to the block 2701 and repeat the operations while the device is operating.

In one embodiment, a baseline update may be called as part of the centroid calculation, instead of in the pre-scanning routine. In another embodiment, the state machine may select the quiet frequency based on listening all frequencies in one cycle before making a decision on which one to use. In other embodiments, some state machine reset conditions may be added to go back to normal hopping order after detecting noise on all frequencies and trying to find the quietest one. In another embodiment, similar performance on actual filtering of input data can be achieved by removing additional features for debouncing and holding XY data on frequency change event or excessive noise. This might result in unwanted false touches but may not impact input data filtering. For example, in one embodiment, the state machine 2700 can be modified to remove blocks 2728-2732. In another embodiment, the ACMF filtering can be excluded and frequency hopping may be performed. For example, in one embodiment, the state machine 2700 can be modified to remove blocks 2710 and 2706 (or at least portions of block 2710 and 2706). In this embodiment, the noise suppression performance may be lower, but might still be good enough for some designs. The state machine 2700 can be considered to have two parts 1) frequency hopping algorithm; and 2) Non-linear ACMF filtering. As described above, the state machine may perform one or the other as would be appreciated by one of ordinary skill in the art having the benefit of this disclosure.

In one embodiment, the state machine performs a method in which the processing logic monitors a signal on multiple electrodes of a sense network at a multiple operating frequencies and determines a noise level of the signal at the multiple operating frequencies. In one embodiment, the processing logic analyzes a time domain signal to analyze the signal at the different frequencies. In another embodiment, the processing logic may perform a fast Fourier transform (FFT) to analyze the signals in the frequency domain as would be appreciated by one of ordinary skill in the art having the benefit of this disclosure. The processing logic selects one of the multiple operating frequencies based on the determine noise levels for scanning the multiple electrodes to detect a conductive object proximate to the multiple electrodes. In one embodiment, the processing logic selects one of the multiple operating frequencies with a lowest noise level. In another embodiment, the processing logic selects any one of the frequencies that are below a specified threshold level, or one of the frequencies in which the noise level is determined to be acceptable. For example, the processing logic may not select the frequency that has the lowest noise level, but may select another frequency that has the second to lowest noise level, or the like. In another embodiment, the processing logic defines a first noise level with the lowest noise level, scans the multiple electrodes in a first scan to detect the conductive object proximate to the multiple electrodes at the selected operating frequency, and filters results of the first scan for localized noise events using the first noise level.

In another embodiment of the method, the processing logic determines if noise is detected on the multiple electrodes. When the noise is detected, the processing logic determines whether the noise is above three noise thresholds. When the noise is above a first of the three noise thresholds, the processing logic activates a first high-noise condition. When the noise is above a second of the three noise thresholds, the processing logic activates a second high-noise condition. When the noise is above a third of the three noise thresholds, the processing logic activates a third high-noise condition. In one embodiment, in the first high-noise condition, the processing logic performs a first position scan of the multiple electrodes, and filters results of the first position scan of the multiple electrodes for localized noise events using a noise filter. In another embodiment, in the second high-noise condition, the processing logic initiates a frequency change to another one of the multiple operating frequencies, and performs a first position scan of the multiple electrodes at the other one of the multiple operating frequencies. In another embodiment, in the third high-noise condition, the processing logic generating an alarm condition that the noise cannot be filtered.

In another embodiment, when the noise is below the three noise thresholds, the processing logic disables a noise filter configured to filter for localized noise events when the noise is below the three noise thresholds.

In yet another embodiment, the processing logic counts a number of active electrodes among the multiple electrodes. The active electrodes are those whose respective signal is greater than a minimum touch signal value and less than a touch threshold. When the number is greater than a threshold number, the processing logic initiates a frequency change to another one of the multiple operating frequencies. In a further embodiment, the processing logic determines the minimal signal value based on a signal value of one or more conductive object detected proximate to the multiple electrodes.

In one embodiment, the state machine is implemented in a capacitance sensing system, including a memory device, and a controller coupled to the memory device. The controller may receive signals from a sense network comprising multiple electrodes to detect a conductive object proximate to the multiple electrodes. In one embodiment, the controller includes a noise listening circuit configured to detect a noise level on the multiple electrodes at a multiple operating frequencies, and a frequency hopping state machine configured to select one of the multiple operating frequencies based on the detected noise levels. In one embodiment, the frequency hopping state machine is configured to select the operating frequency with a lowest noise level. Alternatively, the frequency hopping state machine may select other acceptable operating frequencies as described herein. In a further embodiment, the controller also includes a filtering circuit configured to filter for localized noise events when activated.

In one embodiment, the controller is configured to define a first noise level with the lowest noise level and scan the multiple electrodes in a first scan to detect the conductive object proximate to the multiple electrodes at the selected one of the multiple frequencies. The filtering circuit can be used to filter results of the first scan for the localized noise events using the first noise level. In another embodiment, the controller is configured to determine if noise is detected on the multiple electrodes. When the noise is detected, determine whether the noise is above three noise thresholds, the controller can 1) activate a first high-noise condition when the noise is above a first of the three noise thresholds, 2) activate a second high-noise condition when the noise is above a second of the three noise thresholds, 3) activate a third high-noise condition when the noise is above a third of the three noise thresholds, 4) and disable the filtering circuit when the noise is below the three noise thresholds. In yet a further embodiment, the controller includes an alarm circuit to generate an alarm condition when the noise is above the third noise threshold level.

In another embodiment, the sense network includes multiple electrodes, including a first set of transmit (TX) electrodes and a second set of receive (RX) electrodes. In this embodiment, the controller is configured to measure a mutual capacitance between at least one of the first set of TX electrodes and an individual one of the second set of RX electrodes. In one embodiment, the noise listening circuit is configured to detect the noise level on the second set of RX electrodes. In another embodiment, the noise listening circuit is configured to detect the noise level on the first set of TX electrodes and the second set of RX electrodes.

In another embodiment, a host device includes a display, a capacitance sensing array disposed in connection with the display, and a touchscreen controller coupled to the capacitance sensing array. The capacitance sensing array may include multiple electrodes, such as in rows and columns of electrodes. The intersections between the column and row electrodes may be considered sensors for measuring mutual capacitance, such as those of an all-points-addressable (APA) array. The capacitance sensing array may also be disposed in self-capacitance configurations. The capacitance sense array may be similar to the sense network as described herein. The touchscreen controller includes a capacitance sensing circuit coupled to the capacitance sensing array, and a noise listening circuit coupled to the capacitance sensing array. The noise listening circuit is configured to detect noise on the capacitance sensing circuit from at least one noise source at multiple frequencies. The touchscreen controller is configured to select one of the multiple frequencies, such as the frequency with a lowest noise level, for subsequent scanning of the capacitance sensing array. In another embodiment, the touchscreen controller is configured to apply a noise filter to an output of the capacitance sensing circuit when noise is above a first noise threshold and below a second noise threshold. The noise filter may be at least one of a common mode filter, a local noise filter, a median filter, a non-linear filter, or an adaptive jitter filter (AJF).

The state machine may be modified in various ways as would be appreciated by one of ordinary skill in the art having the benefit of this disclosure. For example, modifications may be made in the frequency hopping state machine to improve system stability and efficiency. In one embodiment, the baseline update can be called in the centroid calculation instead of in the pre-scanning routine. In another embodiment, modifications can be made to incorporate an inactive baseline update, as illustrated in FIG. 28.

FIG. 28 is a flow chart illustrate a method 2800 of an inactive baseline update according to one embodiment. The method 2800 may be performed by processing logic that may comprise hardware (circuitry, dedicated logic, etc.), software (such as is run on a general purpose computing system or a dedicated machine), firmware (embedded software), or any combination thereof. In one embodiment, the controller 330, 430, 530 and 630 of FIGS. 3, 4, 5 and 6 performs some of operations of method 2800. Alternatively, other components of the capacitance sensing system 300, 400, 500, and 678 of FIGS. 3, 4, 5, and 6 can perform some or all of the operations of method 2800.

Referring to FIG. 28, the method 2800 begins with determining if there are touches detected (block 2801), for example, by determining if the number of touches (fingerNum) is equal to zero. If yes, the processing logic determines if a counter, baseline update counter, is greater than a specified threshold, update_needed (block 2802). If yes at block 2802, the processing logic determines if the baseline update number is not equal to the active configuration (block 2804). If yes at block 2804, the processing logic switches the baseline update number configuration (block 2805) and listens to the noise (block 2806). Next, the processing logic determines if the noise is detected (block 2807). If the noise is not detected, the processing logic disables ACMF filter (block 2808), scans the sensors (block 2809), updates baselines (block 2810), restores the ACMF filter settings (block 2811), switch back to the active configuration (block 2812), resets the baseline update counter (block 2813), and increments the baseline update number. Returning back to block 2804, if the processing logic determines that the baseline update number is not the active configuration, the processing logic skips blocks 2805-2813, and the processing logic proceeds to block 2814 to increment the baseline update number.

Next, the processing logic determines if the baseline update number if greater than the available configurations (block 2815). If yes at block 2815, the processing logic resets the baseline update number to zero (block 2816), and ends the baseline update (block 2817). Returning back to block 2807, if the processing logic does not detect noise, the processing logic ends the baseline update at block 2817. Returning back to block 2802, if the processing logic determines that the baseline update counter is not greater than the specified threshold, the processing logic increments the baseline update counter (block 2803), and proceeds to block 2817 to end the baseline update.

In one embodiment, the baseline update algorithm may be performed for inactive frequencies for each user defined number of UPDATE_NEEDED cycles for one frequency even if the noise level for active configuration is high. In another embodiment, an additional check for noise level for this particular configuration that needs an update may be performed before updating the baselines. The baselines may bee updated in cases of no touch on the panel and a quiet noise state. These embodiments may improve the baseline correction and baseline tracking under different environmental conditions, such as those caused by temperature, humidity, or the like.

The embodiments described herein provide an improvements to existing listening methods to force frequency hops that helps the state machine be more stable, eliminating unnecessary hopping as described above. The embodiments described herein also describe a debounce algorithm that may prevent reporting touches on a first cycle after the frequency configuration is changed. This may be done to make sure that the new configuration is quite enough. The embodiments described herein may listen to all the frequencies and select the quietest one. The algorithms may listen to all available configurations in the same scanning cycle prior to selecting one. This may reduce the use of prior history of the frequencies when the noise environment may have been different than the current noise environment. The embodiments described herein may also prevent reporting of position changes in excessive noise conditions to prevent sending false, unexpected touches to the host.

The embodiments described herein may be used by a capacitance sensing system that uses a touchscreen controller to perform panel scanning of the sense network, such as an ITO panel. Scanning the frequency at which the panel is being scanned may interact with the external noise source and may cause unwanted noise in the capacitance sensing system. The embodiments described herein can be used to detect the noisy conditions and switches to frequencies to avoid overlapping with the frequencies of the external noise sources. This may be done by switching the operating frequency between the available operating frequencies using the frequency hopping algorithm described herein.

The embodiments described herein may be used in devices with requirements of 3Vpp noise with 30% duty cycle and a frequency range of 1-200 kHz. Alternatively, the embodiments may be used in other devices that have different requirements as would be appreciated by one of ordinary skill in the art having the benefit of this disclosure.

It should be noted that various embodiments are described in the context of capacitance sensing techniques on touch devices. Other types than capacitance sensing device are affected by external noise sources, but some of these devices use signals on some frequencies that are not dependent on other external devices. For example, a radio should work on the same frequency as the other external devices. However, if the device is using the signal on some particular frequency, such as for its internal use, the embodiments described herein can be used in such devices. Modifications to the listening and frequency hopping techniques may need to be modified based on the particulars of the device in which they are used. however, these modifications would be appreciated by one of ordinary skill in the art having the benefit of this disclosure. The embodiments described herein can be used to find a quite frequency in the operational frequencies of the device. The quite frequency may not overlap with any external noise source so as to result in noise suppression in the system. The embodiments described herein may listen to all available frequencies every time to pick the quietest one after all configurations were tried. The embodiments described herein may also perform a filter reset when transitioning to a new frequency to avoid false touches or lift-offs. The embodiments described herein may also perform an additional force hop activation algorithm for avoiding false touches even when the noise does not rise to the level of exceeding the change frequency threshold. The frequency hopping algorithm may be configured to hop between multiple frequencies, such as 2 or more available operating frequencies as would be appreciated by one of ordinary skill in the art having the benefit of this disclosure. The embodiments described herein may increase a finger threshold when the detected noise is above a specified threshold as described above.

Figure 29:
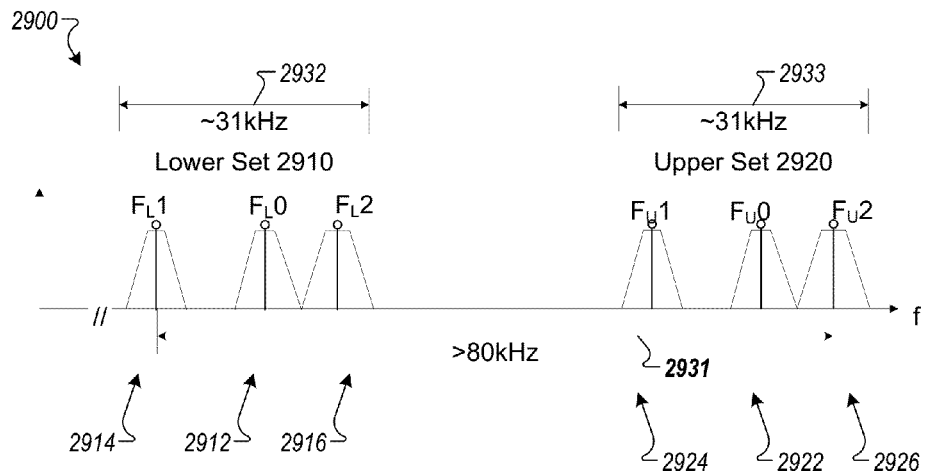
FIG. 29 is a graph illustrating two frequency sets of operating frequencies on a TX signal frequency axis according to one embodiment.

The embodiments described below include 'frequency selection' with two frequency sets, referred to herein as 'frequency set selection'. In these embodiments, two frequency sets include two or more operating frequencies. The frequency sets may be separated at a significant distance. For example, in one embodiment, the difference of frequencies between the first and second frequency sets is greater than 80 kHz. This separation in frequencies may be measured from the upper set's maximum frequency and the lower set's minimal frequency should be more than 80 kHz. FIG. 29 shows an example of frequency sets' positions.

FIG. 29 is a graph 2900 illustrating two frequency sets 2910, 2920 of operating frequencies on a TX signal frequency axis according to one embodiment. The lower frequency set 2910 includes three operating frequencies, including $F_L0$ 2912, $F_L1$ 2914, and $F_L2$ 2916. The upper frequency set 2920 includes three operating frequencies, including $F_U0$ 2922, $F_U1$ 2924, and $F_U2$ 2926. In one embodiment, the $F_L0$ 2912 is 103 kHz, $F_L1$ 2914 is 117 kHz, $F_L2$ 2916 is 127 kHz, $F_U0$ 2922 is 163 kHz, $F_U1$ 2924 is 180 kHz, and $F_U2$ 2926 is 194 kHz. In this embodiment, a separation 2932 in frequencies within the lower set 2910 is less than 30 kHz and a separation 2933 in frequencies within the upper set 2920 is close to 30-31 kHz. A separation 2931 in frequencies between the lower set 2910 and the upper set 2920 is equal to or greater than 80 kHz. In this embodiment, the lower set 2910 and the upper set 2920 both include three operating frequencies per set. In another embodiment, one of the lower set 2910 or upper set 2920 include only two operating frequencies, while the other includes three or more. In another embodiment, the lower set 2910 and the upper set 2920 includes three or more operating frequencies each.

Figure 30:
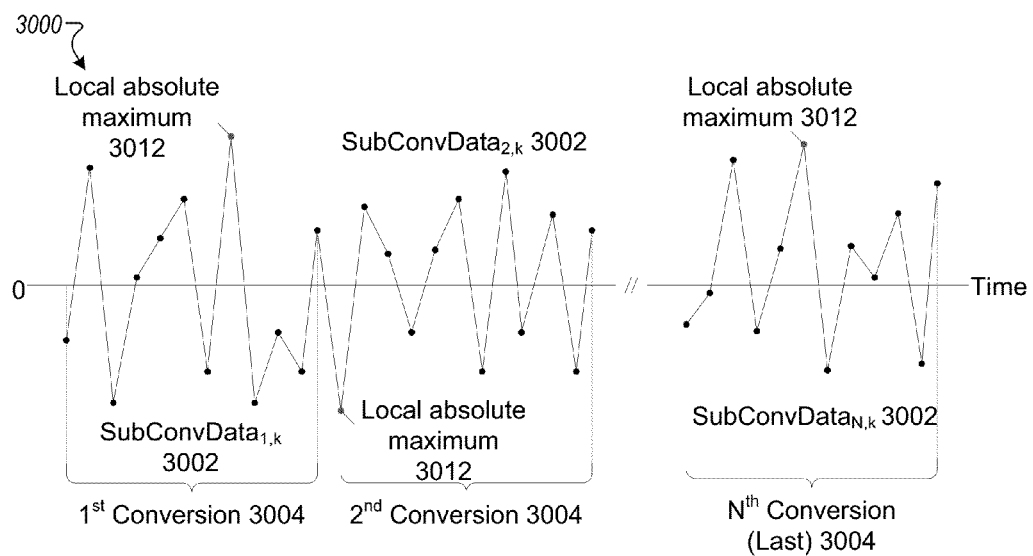
FIG. 30 is a graph illustrating sub-conversions of capacitance values measured during multiple conversions over time according to one embodiment.

Frequency selection and frequency set selection can be implemented by computing multiple noise metrics. For example, one solution to switch frequencies is based on two metrics groups, each having one or more noise metrics. The first metrics group is responsible for switching the frequencies inside one set and the second metrics group is responsible for switching between the frequencies sets. The values of the metrics for the upper and lower sets differ because the scanning successions in them differ. FIG. 30 illustrates sub-conversions of multiple conversions that can be used for the noise metrics calculation. It should be noted that sub-conversions may be one or any number of samples of the capacitance values measured on the plurality of electrodes. As described herein, the sub-conversions are sample values representing the capacitance values measured on the electrodes and the conversions are a specified number of sub-conversions.

FIG. 30 is a graph 3000 illustrating sub-conversions of capacitance values measured during multiple conversions over time according to one embodiment. The graph 3000 includes sub-conversion data ($SubConvData_{i,k}$) 3002 in each of the conversions 3004 ($1^{st}$ conversion to Nth conversion). In each of the conversions, a local absolute maximum 3012 is determined. There are three noise metric calculations described below: a first noise metric (NM1), a second noise metric (NM2), and third noise metric (NM3). Different combinations of these noise metrics can be used to switch between frequencies within a set and to switch between frequency sets.

In one embodiment, two noise metrics, namely NM2 and NM3, are used for switching between the frequencies of one set. The main noise metric, NM2, uses the sub-conversion values obtained from the listening scanning and is calculated according to following formula:

$$NM2 = \frac{\sum_{i=1}^{N} \frac{1}{N_{sub}} \cdot \left| \sum_{k=1}^{N_{sub}} SubConvData_{i,k} \right|}{\sum_{i=1}^{N} \max_i(\{|SubConvData|\})} \cdot 100$$

Figure 31:
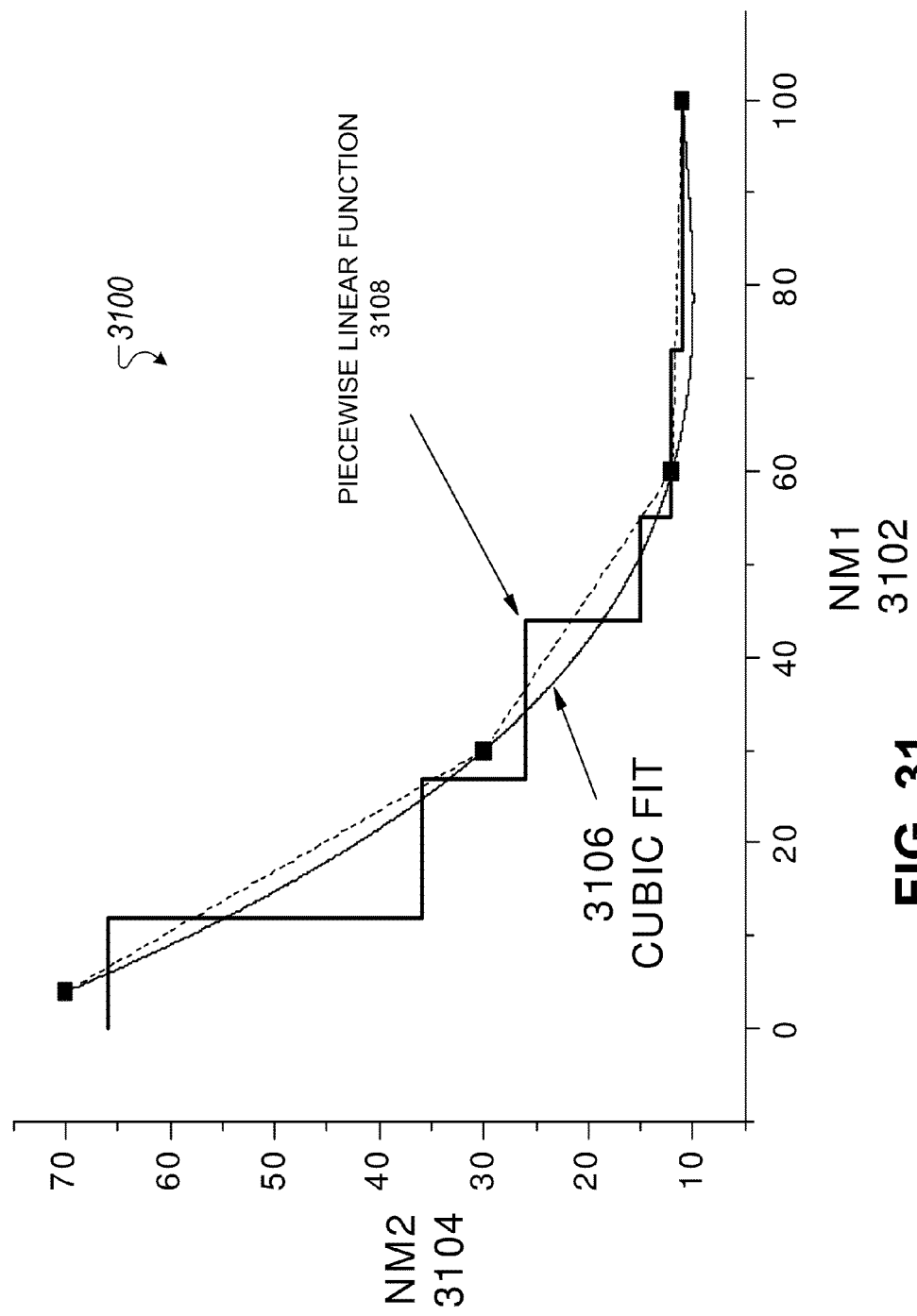
FIG. 31 is a graph illustrating a non-linear dependence of a second noise metric (NM2) and a first noise metric (NM1) and a cubit fit of the same according to one embodiment.

The NM2 is measured between 0 and 100. A dynamic threshold may be used for noise NM2 as necessary because this noise metrics is not sensitive to noise amplitude as described in more detail below. The dynamic threshold allows correct switching between frequencies in the one set. In another embodiment, the NM2 can be made to be dependent on noise amplitude by using a coefficient with the NM2 calculation that is dependent on the noise amplitude. But, it may be simpler to create a dynamic threshold as shown in FIG. 31, which shows experimental dependencies of the NM2 from the NM1. In one embodiment, cubic fitting shows good approximation of the dependence, but it is not possible to realize in integer mathematics. Therefore, a piecewise linear function may be used for implementing the dynamic threshold for NM2 in firmware or other processing logic.

FIG. 31 is a graph 3100 illustrating a non-linear dependence of NM2 and NM1 and a cubic fit 3106 of the same according to one embodiment. The non-linear dependence of NM1 3102 vs. NM2 3104 is represented by the cubic fit 3106. The cubic fit 3106 can be expressed with the following equation:

$$y = A + B^*x + C^*x^2 + D^*x^3$$

Although cubic fitting shows good approximation of the non-linear dependence, a piecewise linear function 3108 can be used to approximate the non-linear dependence. The piecewise linear function 3108 can be used as the dynamic threshold for NM2 3104.

Two metrics of the second group can be used for switching between the frequency sets. The first of the two noise metrics, NM3, uses the sub-conversions values obtained in the following scanning and is calculated according to following formula:

$$NM3 = \frac{\sum_{i=1}^{N} \frac{1}{N_{sub}} \cdot \sum_{k=1}^{N_{sub}} |SubConvData_{i,k}|}{\sum_{i=1}^{N} \max_i(\{|SubConvData|\})} \cdot 100$$

The NM3 is measured between 0 and 100. NM3 reflects the energy of the noise component of the signal. The second noise metric for both groups metrics for both metrics groups uses the sub-conversions or sample values obtained during the listening scanning. There is an absolute value maximum 3012 among the sub-conversions 3002 or sample values in each conversion 3004. The average sum of the found local maximums 3012 is used as a metrics and is calculated according to following formula:

$$NM1 = \frac{1}{N}\sum_{i=1}^{N} \max_i (\{|SubConvData|\})$$

N is the number of conversions 3004 in listening scanning.

In one embodiment, the first group of noise metrics includes NM2 and NM1 for switching between frequencies within one set and the second group of noise metrics includes NM2 and NM1 for switching between frequency sets.

In one embodiment, processing logic (e.g., hardware, software, firmware or any combination thereof) is configured to monitor a signal on multiple electrodes of a sense network. The sense network is configured to operate according to multiple operating frequencies within two frequency sets, namely a first frequency set and a second frequency set. The processing logic determines a first group of one or more noise metrics of noise in the signal and determines a second group of one or more noise metrics of the noise in the signal. The processing logic switches from a first operating frequency in the first frequency set to a second operating system in the first frequency set based on the first group of noise metrics and switches from the first operating frequency to a third operating frequency in the second frequency set based on the second group of noise metrics. In one embodiment, the processing logic switches from the first operating frequency to the third operating frequency by switching to one of the frequencies in the second frequency set that is farthest away in frequency from the first operating frequency. Alternatively, the processing logic can switch to other frequencies in the second set based on other criteria.

In one embodiment, the first frequency set includes three or more non-overlapping frequency bands, each centered at one of three operating frequencies of the first frequency set. The second frequency set (upper or lower) may include three or more non-overlapping frequency bands, each centered at one of three operating frequencies of the second frequency set. Alternatively, the second frequency set may include two non-overlapping frequency bands, each centered at one of two operating frequencies of the second frequency set. In one embodiment, a first separation in frequencies between the first frequency set and the second frequency set is greater than a second separation in frequencies within the first frequency set and than a third separation in frequencies within the second frequency set.

In one embodiment of determining the second group of noise metrics, the processing logic obtains multiple sub-conversions that represent capacitance values measured on the electrodes. The processing logic calculates the NM3 based on the sub-conversions, where NM3 represents an energy level of the noise in the signal. The processing logic calculates NM1 based on the sub-conversions, where NM1 represents an average sum of absolute value maximums among the sub-conversions in a number of conversion. The second group includes the calculated NM1 and NM3. In one embodiment of determining the first group of noise metrics, the processing logic calculates NM2 based on the sub-conversions and uses NM1, which is already calculated for the second group of noise metrics.

In the embodiments described below, various switching techniques can be used to determine when to switch to a different frequency within a set and to switch to a different frequency set. For example, a first switching technique uses a state machine to frequency hop and frequency set hop as described below.

Figure 32:
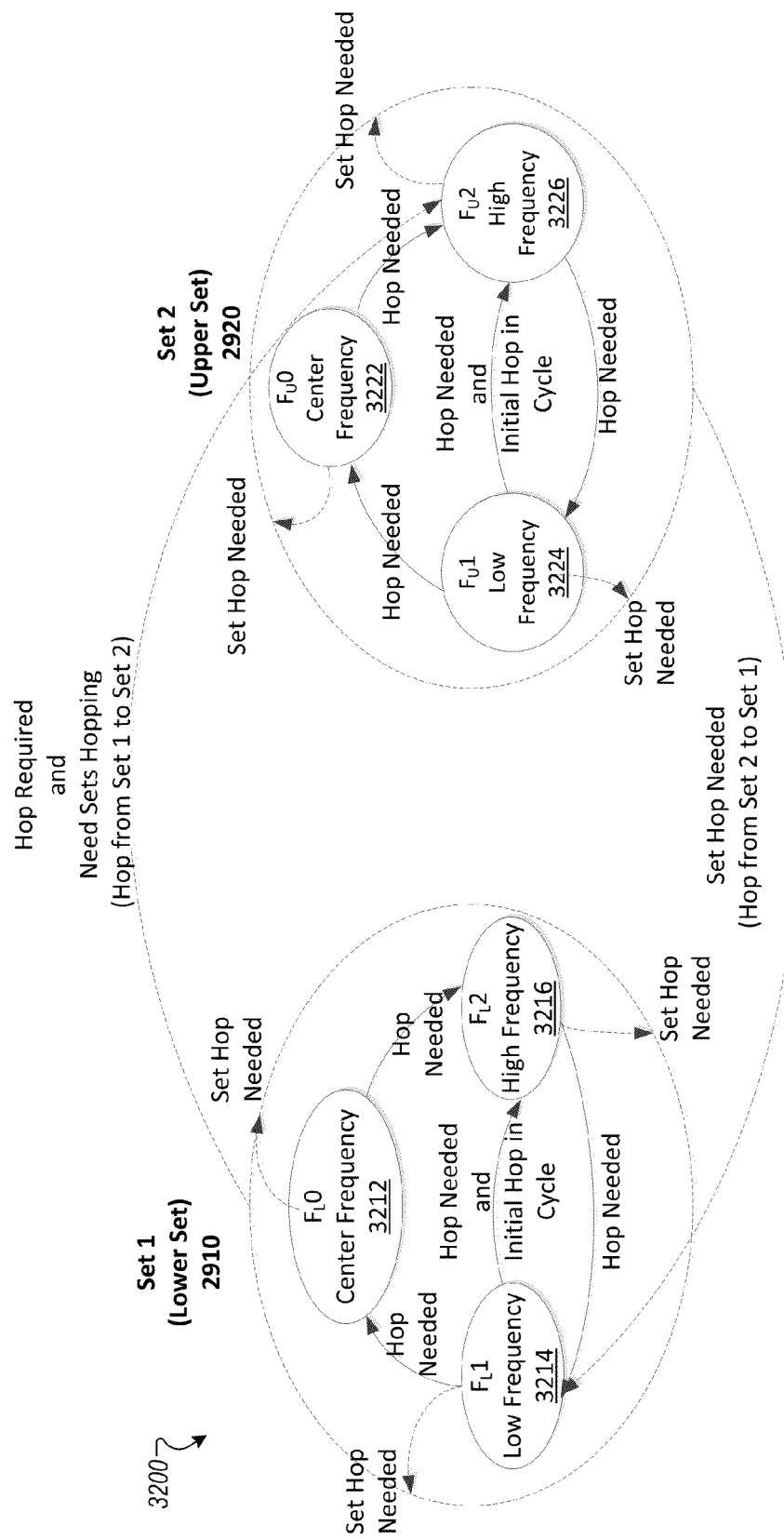
FIG. 32 is a state diagram illustrating a first frequency switching technique according to an embodiment.

FIG. 32 is a state diagram 3200 illustrating a first frequency switching technique according to an embodiment. The state diagram 3200 includes a state for each of the operating frequencies and the states are grouped into the two sets. In particular, the first frequency set 2910, which may be the lower set, includes a first operating frequency state 3212 ($F_L 0$), a second operating frequency state 3214 ($F_L 1$), and a third operating frequency state 3216 ($F_L 2$). The second frequency set 2920, which may be the upper set, includes a fourth operating frequency state 3222 ($F_U 0$), a fifth operating frequency state 3224 ($F_U 1$), and sixth operating frequency state 3226 ($F_U 2$).

In one embodiment, the mutual changeover between frequencies (e.g., f1↔f2) within a frequency set is a priority, keeping with the frequency selection techniques. If the state machine 3200 determines that no frequency provides the necessary noise level, the frequencies continue switching in the cycle and the number of the passed cycles may be counted by the cycle counter. Frequency set switching may be possible on two conditions: first, if the noise metrics indicate that a set hop is needed; or second, if no frequencies in current set provide acceptable noise level, such as after dynamically inspecting all operating frequencies in the set. It should be noted that frequency set switching is allowed from any operating frequency to any other operating frequency. However, in one embodiment, a hop from one set to another set may be realized using the most faraway frequencies ($F_L 1$ and $F_U 2$). That is hop from lower set to upper set occurs to $F_U 2$ and inversely to $F_L 1$. Alternatively, other settings may be used for frequency set hops.

Described below is a second frequency switching technique. The main purpose of this technique is to determine an operating frequency with the least amount of noise within a current frequency set. This technique performs three listening scans for finding the quietest operating frequency in the set. If no quite frequency is found, then the technique can switch frequency sets. This switching technique may provide optimal operating frequencies based on the actual noise in the operating frequencies, but may decrease the panel's refresh rate. Frequency set switching may be possible on two conditions: first, if the operating frequencies in the current set do not provide an acceptable noise level, second, even when the quietest operating frequency is found in the current set (using NM2), other noise metrics indicate that a set hop is needed.

Similar to the first switching technique, the frequency set switching is allowed from any operating frequency to any other operating frequency. However, in one embodiment, a hop from one set to another set may be realized using the most faraway frequencies ($F_L 1$ and $F_U 2$). That is hop from lower set to upper set occurs to $F_U 2$ and inversely to $F_L 1$. However, in this second switching technique no prioritized switching is used.

Figure 33:
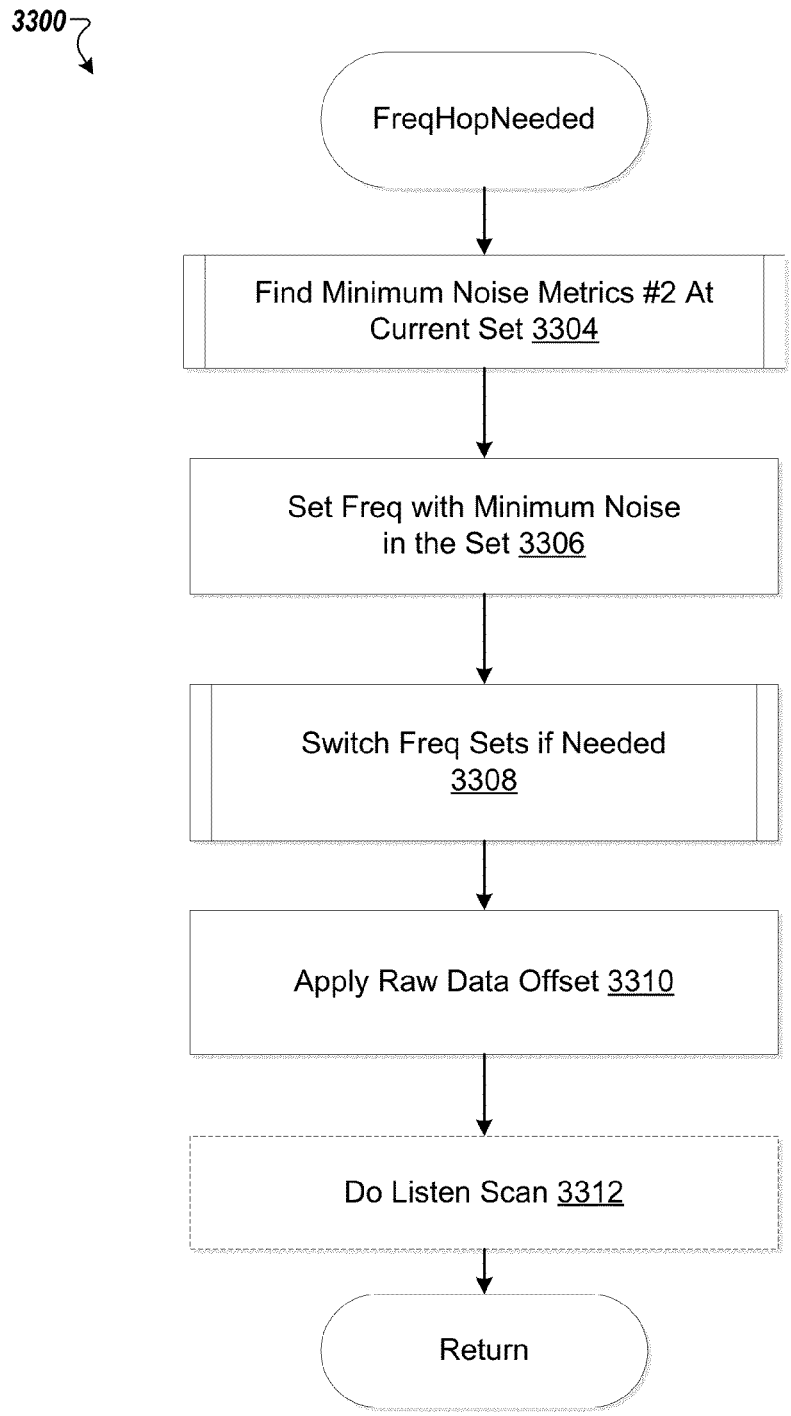
FIG. 33 is a flow chart illustrating a second frequency switching technique according to an embodiment.

FIG. 33 is a flow chart illustrating a second frequency switching technique 3300 according to an embodiment. The method 3300 may be performed by processing logic that may comprise hardware (circuitry, dedicated logic, etc.), software (such as is run on a general purpose computing system or a dedicated machine), firmware (embedded software), or any combination thereof. In one embodiment, the controller 3300 performs some of operations of method 3300. Alternatively, other components of the capacitance sensing systems can perform some or all of the operations of method 3300.

Referring to FIG. 33, the method 3300 begins operations for determining whether a frequency hop is needed by finding a minimum noise metric for NM2 at a current frequency set (block 3304) and setting the operating frequency with the minimum noise in the current set (block 3306). Additional details of block 3304 are described and illustrated with respect to FIG. 34. The processing logic switches the frequency set if needed (block 3308). Additional details of block 3308 are described and illustrated with respect to FIG. 35. The processing logic applies a raw data offset (block 3310) and performs a listen scan (block 3312), and the method ends. In this embodiment, if a frequency hop is needed, the processing logic performs three listen scans and stores the value of NM2 and noise metric information about frequency set selection. As noted above, FIG. 34 and FIG. 35 show the algorithms of frequency search with minimum noise in the set (block 3304) and sets switching (block 3308).

Figure 34:
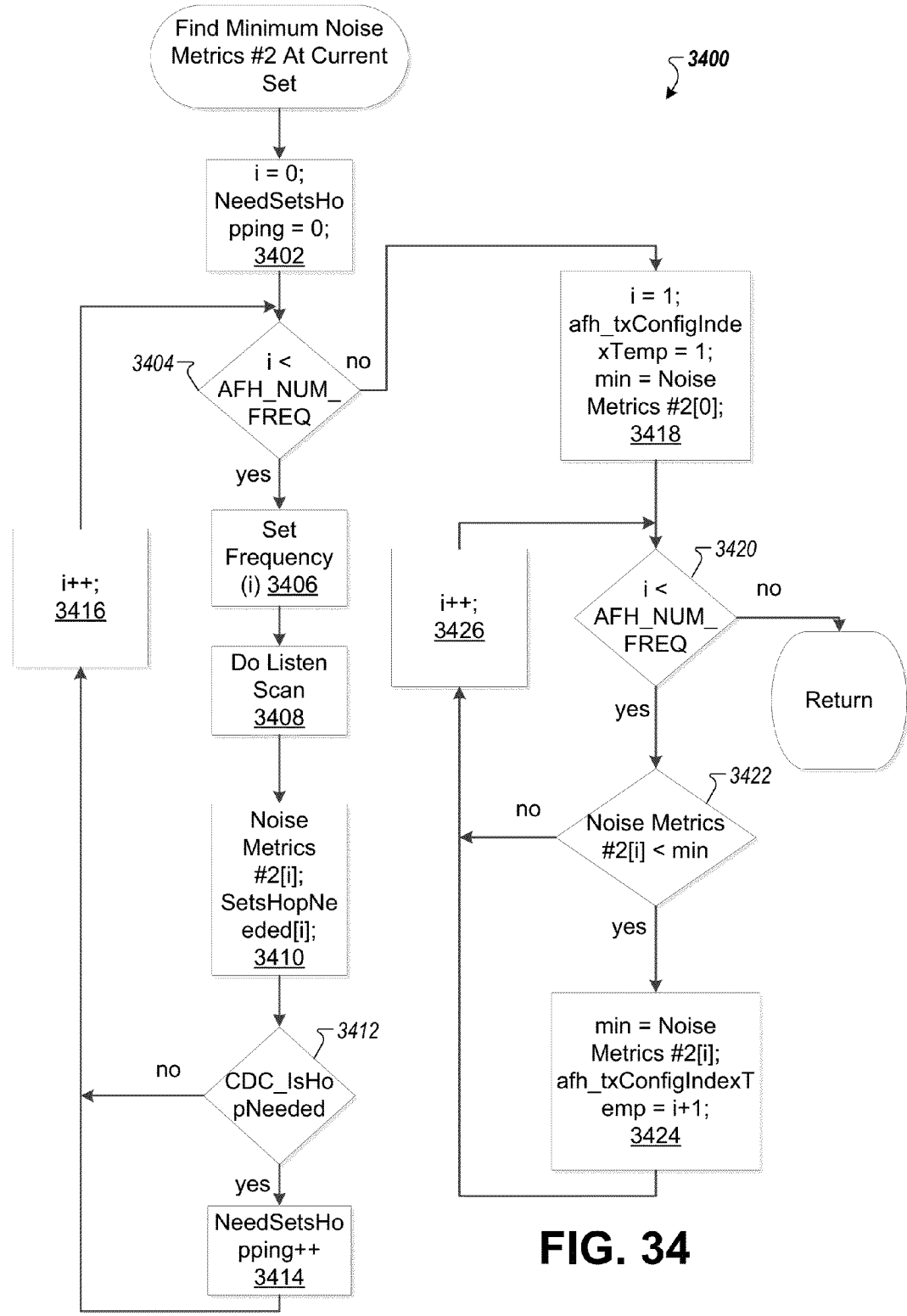
FIG. 34 is a flow chart illustrating a method of determining a minimum NM2 at a current set for the second frequency switching technique according to an embodiment.

FIG. 34 is a flow chart illustrating a method 3400 of determining a minimum NM2 at a current set for the second frequency switching technique according to an embodiment. The method 3400 may be performed by processing logic that may comprise hardware (circuitry, dedicated logic, etc.), software (such as is run on a general purpose computing system or a dedicated machine), firmware (embedded software), or any combination thereof. In one embodiment, the controller 3400 performs some of operations of method 3400. Alternatively, other components of the capacitance sensing systems can perform some or all of the operations of method 3400.

Referring to FIG. 34, the processing logic beings with initializing values of a counter and a register indicating a need for frequency set selection (block 3402), and the processing logic determines if the count is less than AFH_NUM_FREQ AFH_NUM_FREQ is the number of TX frequencies in one set (lower or upper), such as 3 TX frequencies for both sets. Block 3404 is used to cycle through all TX frequencies in one set. If so, the processing logic sets the frequency (block 3406) and performs a listening scan (block 3408). The processing logic determines the NM2 and sets the registers to a first value (block 3410). The processing logic determines if a hop is needed (block 3412). If not, the count is incremented (block 3416) and returns to block 3404. If a hop is needed at block 3412, the processing logic increments the register representing the need for frequency set selection (block 3414), then increments the count (block 3416), and returns to block 3404.

If the block 3404 is a no, the processing logic sets the count to one, and sets afh_txconfigindexTemp to one. The variable afh_txconfigindexTemp contains a temporary index for the current TX frequency in the set. The block 3418 initialize the algorithm to find the quietest frequency using data from a NM2[ ] array. The processing logic then determines if the count is less than AFH_NUM_FREQ (block 3420). If so, the processing logic determines if NM2 is less than the minimum NM2 (block 3422). If not, the counter is incremented (block 3426), and returns to block 3420. If yes at block 3422, the processing logic sets the NM2 to be the minimum NM2, and the index afh_txconfigindexTemp is incremented (block 3424), then increments the counter (block 3426), and returns to block 3420. When at block 3420, the processing logic returns (to block 3306 in FIG. 33).

Figure 35:
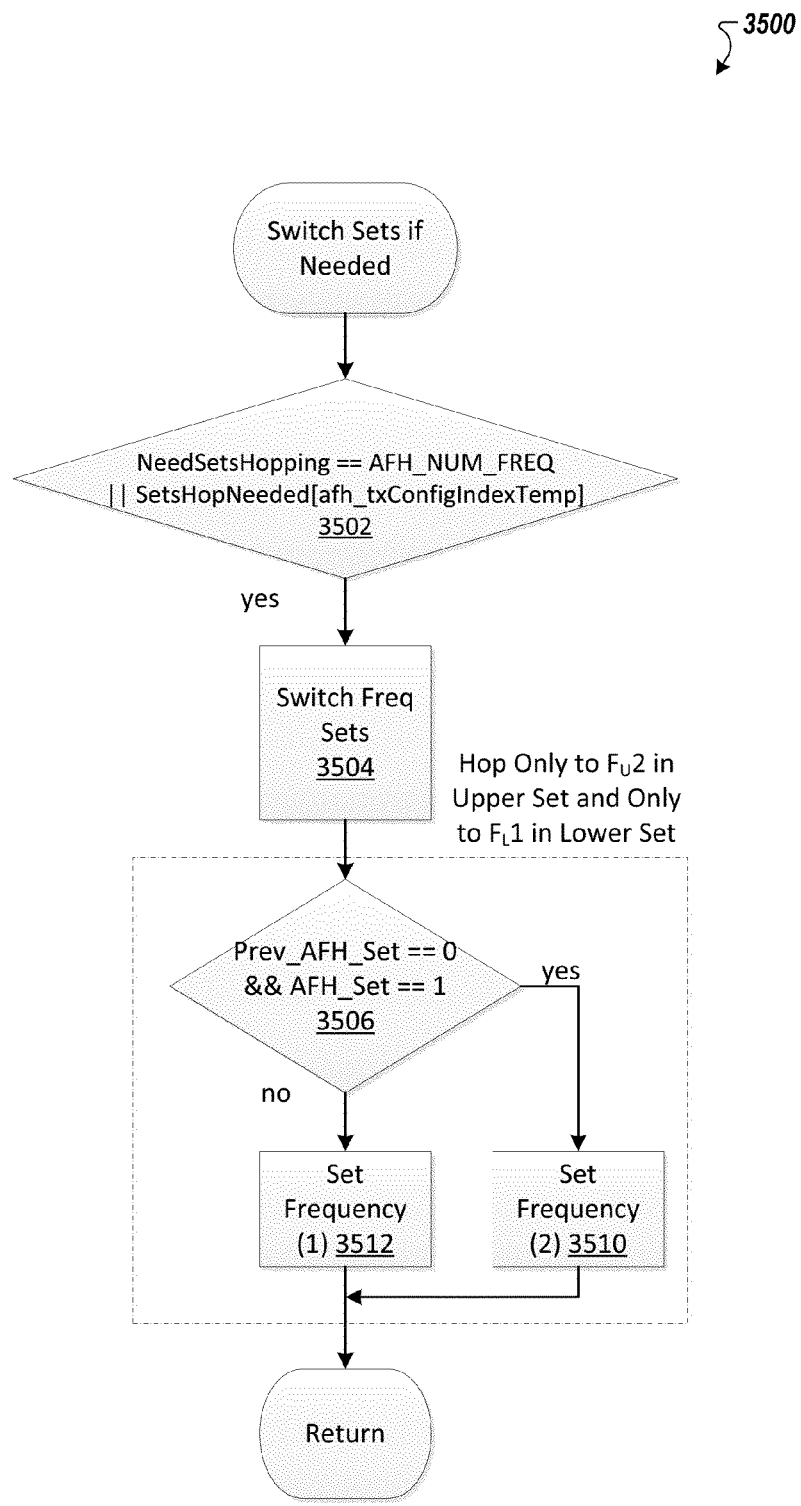
FIG. 35 is a flow chart illustrating a method of determining if switching frequency sets is needed from the current set for the second frequency switching technique according to an embodiment.

FIG. 35 is a flow chart illustrating a method 3500 of determining if switching frequency sets is needed from the current set for the second frequency switching technique according to an embodiment. The method 3500 may be performed by processing logic that may comprise hardware (circuitry, dedicated logic, etc.), software (such as is run on a general purpose computing system or a dedicated machine), firmware (embedded software), or any combination thereof. In one embodiment, the controller 3400 performs some of operations of method 3500. Alternatively, other components of the capacitance sensing systems can perform some or all of the operations of method 3400.

Referring to FIG. 35, the processing logic (block 3502) determines if the register for the need to set hop is equal to AFH_NUM_FREQ or NMs shows that hop needed. The block 3502 checks the condition if frequency set switching is needed. This may be possible if 1) If all available three frequencies in the current set are unacceptable (NeedSetsHopping==AFH_NUM_FREQ (e.g. 3). (Block 3414); or 2) if NMs (NM1 & NM3) indicates that a set switch is needed. This condition is checking only for one TX frequency which was defined in blocks 3418-3426. The processing logic switches frequency sets (block 3504). If the condition of Prev_AFH_Set==0 and AFH_Set==1 is met at block 3506, the processing logic switches to the highest frequency in the upper set ($F_U 2$) (block 3510). Otherwise, the processing logic switches to the lowest frequency in the lower sets ($F_L 1$) (block 3512). In one embodiment, the frequency set hop may be to the upper operating frequency in the upper set from any of the lower set operating frequencies or to the lower operating frequency in the lower set from any of the upper set operating frequencies. If not, the processing logic returns to block 3310 of FIG. 33.

The embodiments described herein provide the possibility to switch between sets of frequencies (and frequencies in one set). The listener mode can be done by scanning with a disabled TX excitation signal. It should also be noted that various embodiments used two frequency sets with three operating frequencies per set. In other embodiments, other number of operating frequencies than six may be used, such as four, five, or more than six. Also, the number of frequencies can be decreased per set, such as two. Also, two specific switching techniques are disclosed herein, however, other switching techniques to switch between operating frequencies within a set and to switch between sets may be used as would be appreciated by one of ordinary skill in the art having the benefit of this disclosure. Also, the embodiments described above are described in the context of capacitance measurements. However, the embodiments can be used in other applications, such as other ADC-based measurements in noisy environment to improve noise immunity of the system using these embodiments.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
monitoring a signal on a plurality of electrodes of a sense network, the sense network to operate in a first frequency set or a second frequency set, each comprising a plurality of operating frequencies;
determining a first group of one or more noise metrics of noise in the signal;
determining a second group of one or more noise metrics of the noise in the signal;
performing a frequency hop within the first frequency set based on the first group of one or more noise metrics, wherein the frequency hop switches from a first operating frequency to a second operating frequency within the first frequency set; and
performing a frequency set hop from the first frequency set to the second frequency set based on the second group of one or more noise metrics, wherein the frequency set hop switches from the first operating frequency in the first frequency set to an operating frequency in the second frequency set.

2. The method of claim 1, wherein a first separation in frequencies between the first frequency set and the second frequency set is greater than a second separation in frequencies within the first frequency set.

3. The method of claim 1, wherein the first frequency set comprises three or more non-overlapping frequency bands, each centered at one of three operating frequencies of the first frequency set.

4. The method of claim 3, wherein the second frequency set comprises three or more non-overlapping frequency bands, each centered at one of three operating frequencies of the second frequency set.

5. The method of claim 3, wherein the second frequency set comprises two non-overlapping frequency bands, each centered at one of two operating frequencies of the second frequency set.

6. The method of claim 1, wherein the switching from the first frequency set to the second frequency set comprises switching from the first operating frequency to one of the plurality of operating frequencies in the second frequency set that is farthest away in frequency from the first operating frequency.

7. The method of claim 1, wherein the determining the second group of one or more noise metrics comprises:
obtaining a plurality of sub-conversions representing capacitance values measured on the plurality of electrodes;
calculating a third noise metric (NM3) based on the plurality of sub-conversions, wherein the NM3 represents an energy of the noise in the signal; and
calculating a first noise metric (NM1) based on the plurality of sub-conversions, wherein the NM1 represents an average sum of absolute value maximums among the sub-conversions in a number of conversions, wherein the second group of one or more noise metrics comprises the NM1 and the NM3,
wherein the determining the first group of one or more noise metrics comprises calculating a second noise metric (NM2) based on the plurality of sub-conversions, and wherein the first group of one or more noise metrics comprises the NM2 and the NM1.

8. The method of claim 7, wherein the calculating the NM1, NM2, and NM3 comprises calculating the NM1, NM2, and NM3 based on the following equations:

$$NM2 = \frac{\sum_{i=1}^{N} \frac{1}{N_{sub}} \cdot \left| \sum_{k=1}^{N_{sub}} SubConvData_{i,k} \right|}{\sum_{i=1}^{N} \max_i(\{|SubConvData|\})} \cdot 100,$$

where N is the number of conversions in a listening scan, $SubConvData_{i,k}$ is the plurality of sub-conversions in each of the number of conversions;

$$NM3 = \frac{\sum_{i=1}^{N} \frac{1}{N_{sub}} \sum_{k=1}^{N_{sub}} |SubConvData_{i,k}|}{\sum_{i=1}^{N} \max_i(\{|SubConvData|\})} \cdot 100; \text{ and}$$

$$NM1 = \frac{1}{N} \sum_{i=1}^{N} \max_i(\{|SubConvData|\}).$$

9. The method of claim 1, wherein the determining whether the frequency set hop is needed comprises at least one of:
determining that the plurality of operating frequencies in the first set exceed a threshold noise level after a specified number of cycles through the plurality of operating frequencies in the first frequency set; or
determining that a third noise metric (NM3), calculated from a plurality of sub-conversions exceeds a threshold value, wherein the NM3 represents an energy of the noise in the signal.

10. The method of claim 7, further comprising:
identifying the plurality of operating frequencies in a current set of the first frequency set and the second frequency set with a minimum noise metric of the NM2;
switching from a current operating frequency of the plurality of operating frequencies in the current set to the operating frequency with the minimum noise metric of the NM2; and
determining whether a frequency set hop from the current set to another set is needed based on the first group of one or more noise metrics regardless of the NM2 in the current set.

11. A capacitance sensing system, comprising:
a memory device; and
a controller coupled to the memory device, wherein the controller is configured to receive a signal from a sense network comprising a plurality of electrodes to detect a conductive object proximate to the plurality of electrodes, wherein the controller comprises:
a noise listening circuit configured to:
determine a first group of one or more noise metrics of noise in the signal; and
determine a second group of one or more noise metrics of the noise in the signal; and
a frequency selection state machine configured to:
perform a frequency hop within a first frequency set based on the first group of the one or more noise metrics, wherein the frequency hop switches from a first operating frequency in the first frequency set to a second operating frequency in the first frequency set; and
perform a frequency set hop from the first frequency set to a second frequency set based on the second group of the one or more noise metrics, wherein the frequency set hop is switches from the first operating frequency in the first frequency set to an operating frequency in the second frequency set.

12. The capacitance sensing system of claim 11, wherein a first separation in frequencies between the first frequency set and the second frequency set is greater than a second separation in frequencies within the first frequency set.

13. The capacitance sensing system of claim 11, wherein the first frequency set comprises three or more non-overlapping frequency bands, each centered at one of three operating frequencies of the first frequency set, and wherein the second frequency set comprises two or more non-overlapping frequency bands, each centered at one of two operating frequencies of the second frequency set.

14. The capacitance sensing system of claim 11, wherein the noise listening circuit is configured to:
obtain a plurality of sub-conversions representing capacitance values measured on the plurality of electrodes;
calculate a third noise metric (NM3) based on the plurality of sub-conversions, wherein the NM3 represents an energy of the noise in the signal;
calculate a first noise metric (NM1) based on the plurality of sub-conversions, wherein the NM1 represents an average sum of absolute value maximums among the sub-conversions in a number of conversions; and
calculate a second noise metric (NM2) based on the plurality of sub-conversions,
wherein the second group of one or more noise metrics comprises the NM1 and the NM3, and
wherein the first group of one or more noise metrics comprises the NM2 and the NM1.

15. The capacitance sensing system of claim 14, wherein the noise listening circuit is configured to calculate the NM1, NM2, and NM3 based on the following equations:

$$NM2 = \frac{\sum_{i=1}^{N} \frac{1}{N_{sub}} \cdot \left| \sum_{k=1}^{N_{sub}} SubConvData_{i,k} \right|}{\sum_{i=1}^{N} \max_i(\{|SubConvData|\})} \cdot 100,$$

where N is the number of conversions in a listening scan, $SubConvData_{i,k}$ is the plurality of sub-conversions in each of the number of conversions;

$$NM3 = \frac{\sum_{i=1}^{N} \frac{1}{N_{sub}} \sum_{k=1}^{N_{sub}} |SubConvData_{i,k}|}{\sum_{i=1}^{N} \max_i(\{|SubConvData|\})} \cdot 100; \text{ and}$$

$$NM1 = \frac{1}{N} \sum_{i=1}^{N} \max_i(\{|SubConvData|\}).$$

16. The capacitance sensing system of claim 11, wherein the noise listening circuit is configured to switch from the first operating frequency to an operating frequency in the second frequency set that is farthest away in frequency from the first operating frequency, when performing the frequency set hop.

17. A host device, comprising:
a display;
a capacitance sensing array disposed in connection with the display;
a touch screen controller coupled to the capacitance sensing array, wherein the touch screen controller comprises:
a capacitance sensing circuit coupled to the capacitance sensing array; and
a noise listening circuit coupled to the capacitance sensing array, wherein the noise listening circuit is configured to:
determine a first group of one or more noise metrics of noise in a signal;
determine a second group of one or more noise metrics of the noise in a signal;
perform a frequency hop within a first frequency set based on the first group of the one or more noise metrics, wherein the frequency hop switches from a first operating frequency in a first frequency set to a second operating frequency in the first frequency set; and
performing a frequency set hop from the first frequency set to a second frequency set based on the second group of the one or more noise metrics, wherein the frequency set hop switches from the first operating frequency in the first frequency set to an operating frequency in the second frequency set.

18. The host device of claim 17, wherein the first frequency set comprises three or more non-overlapping frequency bands, each centered at one of three operating frequencies of the first frequency set, and wherein the second frequency set comprises two or more non-overlapping frequency bands, each centered at one of two operating frequencies of the second frequency set.

19. The host device of claim 17, wherein the noise listening circuit is configured to switch from the first operating frequency in the first frequency set to an operating frequencies in the second frequency set that is farthest away in frequency from the first operating frequency when performing the frequency set hop.

\* \* \* \* \*